(12) United States Patent
Choi et al.

(10) Patent No.: US 10,614,887 B2
(45) Date of Patent: *Apr. 7, 2020

(54) NONVOLATILE MEMORY DEVICE AND METHOD OF PROGRAMMING THE SAME

(71) Applicant: SAMSUNG ELECTRONICS CO., LTD., Suwon-si, Gyeonggi-do (KR)

(72) Inventors: Yoon-Hee Choi, Hwaseong-si (KR); Sungyeon Lee, Seoul (KR); Sang-Hyun Joo, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/503,219

(22) Filed: Jul. 3, 2019

(65) Prior Publication Data

US 2019/0341111 A1 Nov. 7, 2019

Related U.S. Application Data

(63) Continuation of application No. 15/611,451, filed on Jun. 1, 2017, now Pat. No. 10,360,983, which is a
(Continued)

(30) Foreign Application Priority Data

Feb. 3, 2014 (KR) .................. 10-2014-0012167

(51) Int. Cl.
 *G11C 16/10* (2006.01)
 *G11C 11/56* (2006.01)
(Continued)

(52) U.S. Cl.
 CPC ............... *G11C 16/10* (2013.01); *G11C 7/04* (2013.01); *G11C 11/5628* (2013.01);
(Continued)

(58) Field of Classification Search
 CPC .......... G11C 16/12; G11C 16/00; G11C 16/08
(Continued)

(56) References Cited

U.S. PATENT DOCUMENTS 7,679,133 B2  3/2010 Son et al.
8,553,466 B2  10/2013 Han et al.
(Continued)

FOREIGN PATENT DOCUMENTS

KR  10-2010-0090968 A   8/2010
KR  10-2011-0009503 A   1/2011
KR  10-2011-0131984 A  12/2011

*Primary Examiner* — Han Yang
(74) *Attorney, Agent, or Firm* — Volentine, Whitt & Francos, PLLC

(57) ABSTRACT

In a method of programming a three-dimensional nonvolatile memory device, a program loop is executed at least one time. The program loop includes a programming step for programming selected memory cells among memory cells and a verifying step for verifying whether the selected memory cells are program-passed or not. In programming the selected memory cells, a level of a voltage being applied to a common source line connected to the memory cells in common may be changed. Thus, in a program operation, power consumption which is needed to charge-discharge the common source line can be decreased while increasing boosting efficiency.

20 Claims, 18 Drawing Sheets

Related U.S. Application Data continuation-in-part of application No. 15/398,594, filed on Jan. 4, 2017, now abandoned, which is a continuation of application No. 15/229,158, filed on Aug. 5, 2016, now Pat. No. 9,564,229, which is a continuation of application No. 14/527,461, filed on Oct. 29, 2014, now Pat. No. 9,424,931.

(51) Int. Cl.
  *G11C 16/04* (2006.01)
  *G11C 7/04* (2006.01)
  *G11C 16/34* (2006.01)
  *G11C 16/08* (2006.01)
  *G11C 16/30* (2006.01)

(52) U.S. Cl.
  CPC .......... *G11C 16/0483* (2013.01); *G11C 16/08* (2013.01); *G11C 16/3459* (2013.01); *G11C 16/30* (2013.01); *G11C 2211/5621* (2013.01)

(58) Field of Classification Search
  USPC ............. 365/185.03, 185.23, 185.25, 185.26
  See application file for complete search history.

(56) References Cited

U.S. PATENT DOCUMENTS

| | | |
|---|---|---|
| 8,559,235 B2 | 10/2013 | Yoon et al. |
| 8,654,587 B2 | 2/2014 | Yoon et al. |
| 9,401,210 B2 * | 7/2016 | Kwon .................... G11C 16/10 |
| 9,424,931 B2 | 8/2016 | Choi et al. |
| 2009/0010221 A1 | 1/2009 | Ginzburg et al. |
| 2009/0066933 A1 | 3/2009 | Takano et al. |
| 2010/0051748 A1 | 3/2010 | Etling |
| 2010/0238732 A1 | 9/2010 | Hishida et al. |
| 2010/0265765 A1 | 10/2010 | Seo et al. |
| 2011/0233648 A1 | 9/2011 | Seol et al. |
| 2012/0063235 A1 | 3/2012 | Yoon et al. |
| 2016/0049192 A1 * | 2/2016 | Lee .................... G11C 16/3427 365/185.03 |

* cited by examiner

NONVOLATILE MEMORY DEVICE AND METHOD OF PROGRAMMING THE SAME

CROSS-REFERENCE TO RELATED APPLICATIONS

This is a Continuation of U.S. application Ser. No. 15/611,451, filed Jun. 1, 2017, which issued as U.S. Pat. No. 10,360,983 on Jul. 23, 2019, and which is a Continuation-In-Part Application of U.S. application Ser. No. 15/398,594, filed Jan. 4, 2017, which is now abandoned and which is a Continuation of U.S. application Ser. No. 15/229,158, filed Aug. 5, 2016, which issued as U.S. Pat. No. 9,564,229 on Feb. 7, 2017, and which is a Continuation of U.S. application Ser. No. 14/527,461, filed Oct. 29, 2014, which issued as U.S. Pat. No. 9,424,931 on Aug. 23, 2016, and which makes a claim of priority under 35 U.S.C. § 119 to Korean Patent Application No. 10-2014-0012167, filed on Feb. 3, 2014, the disclosures of which are incorporated by reference herein in their entireties.

BACKGROUND

The present disclosure relates to semiconductor memory devices, and more particularly, to methods of programming a nonvolatile semiconductor memory device.

Semiconductor memory devices may be classified as either volatile memory devices or nonvolatile memory devices. Volatile memory devices are generally characterized by the loss of stored data when a power supply is interrupted. Examples of volatile memory devices include dynamic random access memory (DRAM) devices and static random access memory (SRAM) devices. Nonvolatile memory devices are generally characterized by the retention of stored data even when a power supply is interrupted. Examples of nonvolatile memory devices include programmable read only memory (PROM) devices, erasable PROM (EPROM) devices, electrically EPROM (EEPROM) devices, flash memory devices, ferroelectric random access memory (FRAM) devices, magnetic random access memory (MRAM) devices, phase change random access memory (PRAM) devices, and resistive random access memory (RRAM) devices.

Among nonvolatile memory devices, flash memory exhibits advantages of high programming speed, low power consumption and high capacity data storage. Thus, data storage devices including flash memory have been widely utilized.

A floating gate type flash memory stores bit information by implanting charges into a floating gate formed of polysilicon. Separately, each memory cell of flash memory can store data as a single level cell (SLC) in which 1 bit (states 1, 0) is recorded in one memory cell, and a multi level cell (MLC) in which at least 2 bits (e.g., states 11, 01, 00, 10) are recorded in one memory cell.

In a program operation of a flash memory, to increase boosting efficiency, a technology of increasing a voltage level of a common source line to a specific level may be applied. However, to achieve this, since a voltage level of the common source line has to be charged and discharged to the same level at every program loop, power consumption may increase.

SUMMARY

Embodiments of the disclosure provide a method of programming a three-dimensional (3D) memory cell array which includes a plurality of memory cell strings, each of the memory cell strings extending in a direction vertical to a substrate, an upper end of each of the memory cell strings being connected with a bit line and a lower end of each of the memory cell strings being connected with a common source line (CSL), and each of the memory cell strings including a plurality of memory cells, each of the plurality of memory cells being programmed by applying a programming voltage to a word line connected with the memory cell. The method includes applying a programming voltage to a selected word line; electrically floating a common source line while applying the programming voltage; applying a verify voltage to the selected word line to determine whether memory cells are program-passed or not; and applying a reference voltage to the common source line while applying the verify voltage.

Embodiments of the disclosure also provide a method of programming a three-dimensional (3D) memory cell array which includes a plurality of memory cell strings, each of the memory cell strings extending in a direction vertical to a substrate, an upper end of each of the memory cell strings being connected with a bit line and a lower end of each of the memory cell strings being connected with a common source line (CSL), and each of the memory cell strings including a plurality of memory cells, each of the plurality of memory cells being programmed by applying a programming voltage to a word line connected with the memory cell. The method includes executing a first programming loop, the first programming loop includes applying a first programming voltage to a selected word line; electrically floating a first common source line voltage to a common source line while applying the first programming voltage; applying a first verify voltage to the selected word line to determine whether memory cells are program-passed or not; and applying a reference voltage to the common source line while applying the first verify voltage. The method further includes executing a second programming loop, the second programming loop including applying a second programming voltage to the selected word line; applying a second common source line voltage to the common source line while applying the second programming voltage; applying a second verify voltage to the selected word line to determine whether memory cells are program-passed or not; and applying the reference voltage to the common source line while applying the second verify voltage, wherein the second programming voltage is greater than the first programming voltage.

Embodiments of the disclosure also provide a method of programming a nonvolatile memory cell array which includes a plurality of memory cell strings, an upper end of each of the memory cell strings being connected with a bit line and a lower end of each of the memory cell strings being connected with a common source line (CSL), and each of the memory cell strings including a plurality of memory cells, each of the plurality of memory cells being connected with one of first word line and second word line, the first word line being associated with a first word line group and the second word line being associated with a second word line group. The method includes executing a first programming loop when the first word line is selected, the first programming loop including: applying a first programming voltage to the first word line; applying a first common source line voltage to the common source line while applying the first programming voltage; applying a first verify voltage to the second word line to determine whether the memory cells connected to the first word line are program-passed or not; and applying a reference voltage to the common source line while applying the first verify voltage. The method further includes executing a second programming loop when the second word line is selected, the second programming loop including: applying a second programming voltage to the second word line; electrically floating the common source line while applying the second programming voltage; applying a second verify voltage to the second word line to determine whether the memory cells connected to the second word line are program-passed or not; and applying the reference voltage to the common source line while applying the second verify voltage. The first word line group is located closer to the common source line than the second word line group.

Embodiments of the disclosure also provide a method of programming a three-dimensional memory cell array having a plurality of memory cell strings, each of the memory cell strings: (1) is connected to a different one of a plurality of bit lines and a common source line, (2) comprises memory cells serially connected between a bit line, among the bit lines, and the common source line, and (3) has a memory cell among the memory cells of the memory cell string that is addressed by a word line. The method includes applying a first programming voltage to the word line during a first programming loop and electrically floating the common source line while applying the first programming voltage to the word line during the first programming loop.

BRIEF DESCRIPTION OF THE FIGURES

Preferred embodiments of the disclosure will be described below in more detail with reference to the accompanying drawings. The embodiments of the disclosure may, however, be embodied in different forms and should not be constructed as limited to the embodiments set forth herein. Rather, these embodiments are provided so that this disclosure will be thorough and complete, and will fully convey the scope of the disclosure to those skilled in the art. Like numbers refer to like elements throughout.

DETAILED DESCRIPTION OF PREFERRED EMBODIMENTS

Figure 1:
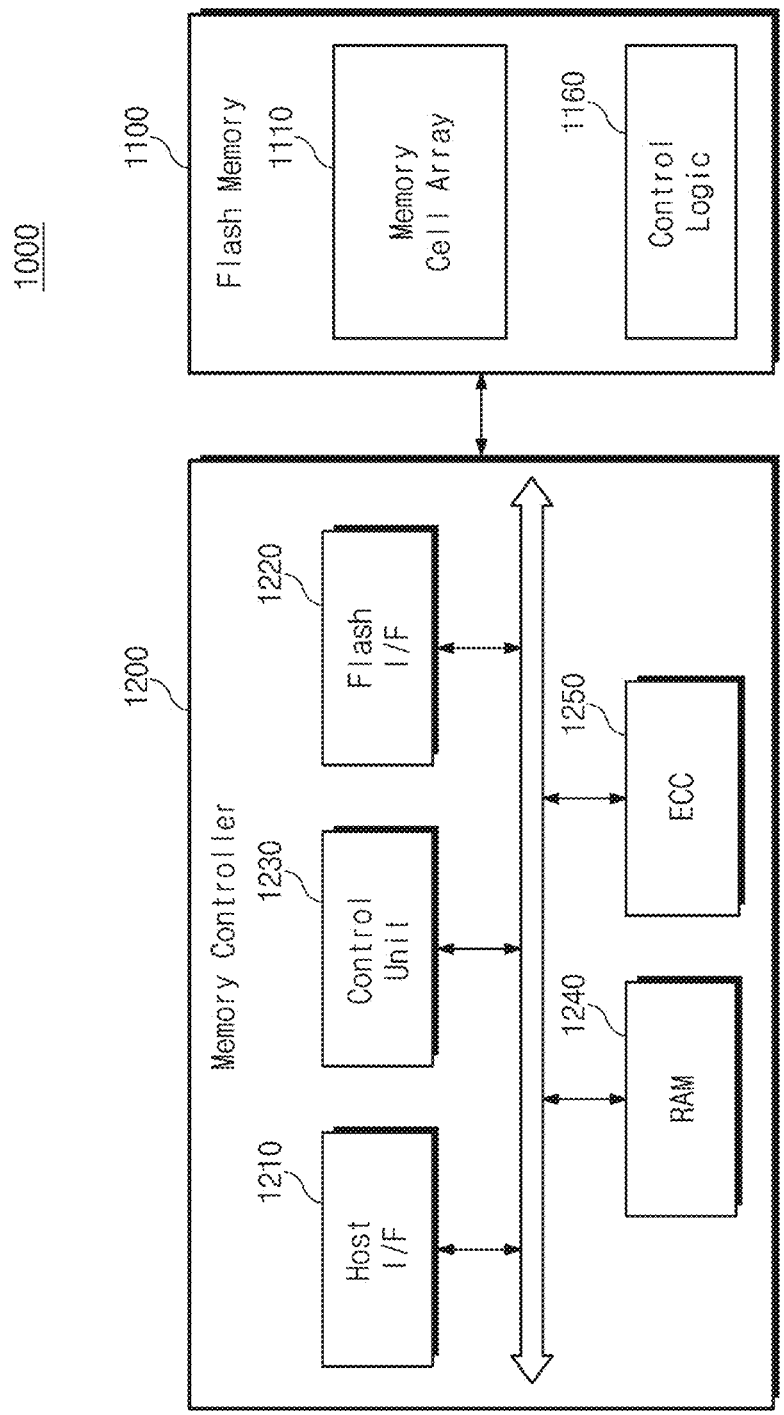
FIG. 1 is a block diagram illustrating a data storage device in accordance with exemplary embodiments of the disclosure.

Embodiments of disclosures will be described more fully hereinafter with reference to the accompanying drawings, in which embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. In the drawings, the size and relative sizes of layers and regions may be exaggerated for clarity. Like numbers refer to like elements throughout.

FIG. 1 is a block diagram illustrating a data storage device in accordance with exemplary embodiments of the disclosure.

Referring to FIG. 1, a data storage device 1000 includes a flash memory 1100 and a memory controller 1200. The data storage device 1000 may include a data storage medium based on a flash memory such as a memory card, a USB memory, an SSD, etc.

Referring to FIG. 1, the flash memory 1100 includes a memory cell array 1110 and control logic 1160. The memory cell array 1110 includes a plurality of memory blocks. Each memory block has a three-dimensional structure (or a vertical structure) being formed in a direction perpendicular to a substrate. The control logic 1160 can control program, read and erase operations using a command CMD, an address ADDR and a control signal CTRL.

The memory controller 1200 controls erase, write and read operations with respect to the flash memory 1100 in response to a request of a host. The memory controller 1200 includes a host interface 1210, a flash interface 1220, a control unit 1230, a RAM 1240 and an ECC circuit 1250.

The memory controller 1200 exchanges data with the host through the host interface 1210. The memory controller 1200 exchanges data with the flash memory 1100 through the flash interface 1220. The host interface 1210 can be connected to the host through a parallel advanced technology attachment (PATA) bus, a serial ATA (SATA) bus, an SCSI, a USB, a PCIe, etc.

The control unit 1230 can control the overall operation (e.g., read, write, file system management, bad page management) of the flash memory 1100. The control unit 1230 may include a central processing unit (CPU), a processor, an SRAM, a DMA controller, etc.

The RAM 1240 operates according to a control of the control unit 1230 and may be used as a work memory, a buffer memory, and a cache memory. In the case that the RAM 1240 is used as a work memory, data being processed by the control unit 1230 is temporarily stored in the RAM 1240. In the case that the RAM 1240 is used as a buffer memory, the RAM 1240 is used to buffer data to be transmitted from the host to the flash memory 1100 or from the flash memory 1100 to the host. In the case that the RAM 1240 is used as a cache memory, the RAM 1240 makes the low speed flash memory 1100 operate at high speed.

The ECC circuit 1250 generates an error correction code (ECC) for correcting a fail bit or an error bit of data received from the flash memory 1100. The ECC circuit 1250 performs an error correct encoding of data being provided to the flash memory 1100 to form data to which a parity bit is added. The parity bit may be stored in the flash memory 1100.

The ECC circuit 1250 can perform an error correct decoding on data output from the flash memory 1100. The ECC circuit 1250 can correct an error using parity. The ECC circuit 1250 can correct an error using a coded modulation such as a low density parity check (LDPC) code, a BCH code, a turbo code, a Reed-Solomon code, a convolution code, a recursive systematic code, a trellis-coded modulation, and a block coded modulation.

Figure 2:
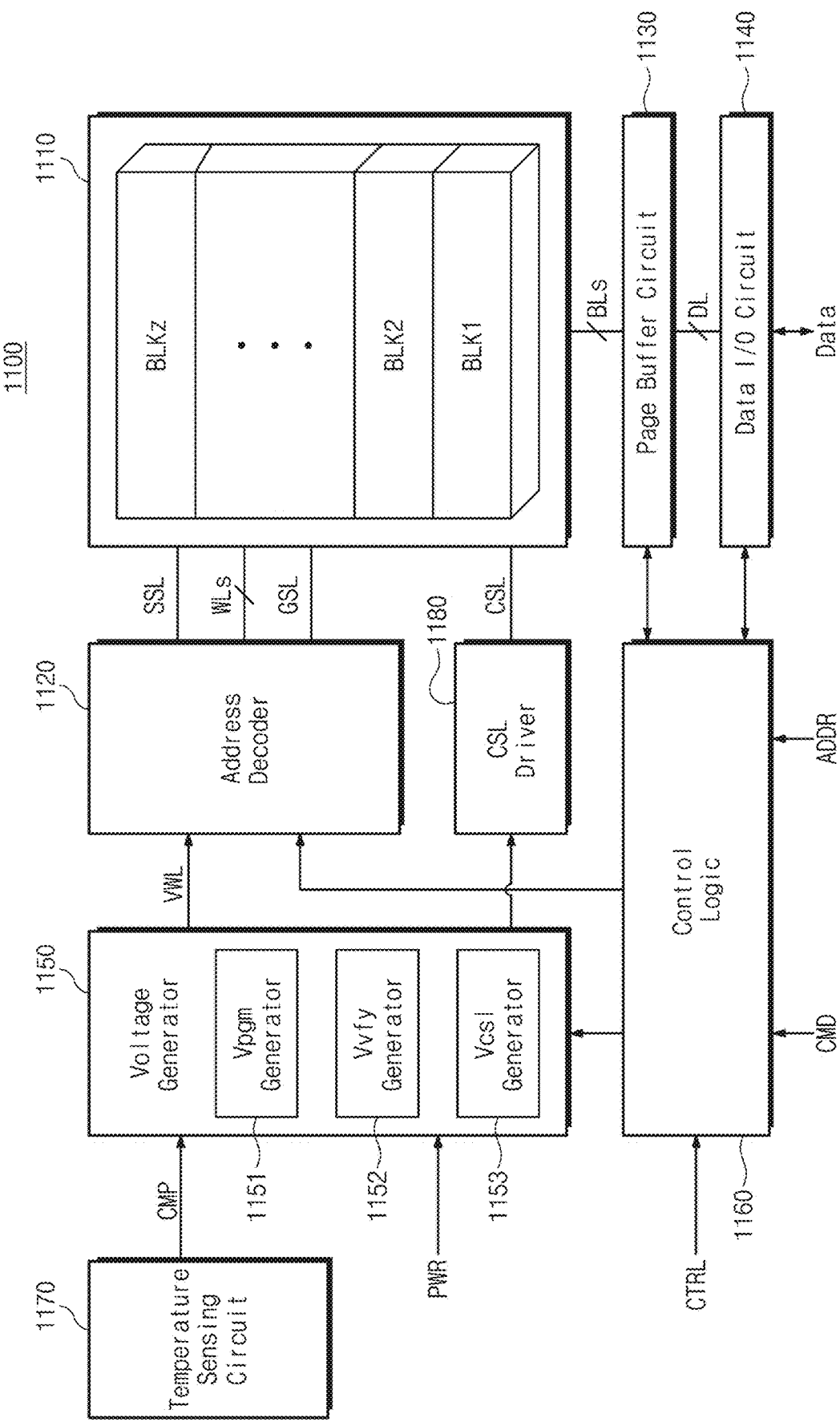
FIG. 2 is a block diagram illustrating an example of a flash memory illustrated in FIG. 1.

FIG. 2 is a block diagram illustrating an example of a flash memory illustrated in FIG. 1.

Referring to FIG. 2, the flash memory 1100 includes a memory cell array 1110, an address decoder 1120, a page buffer circuit 1130, a data input/output circuit 1140, a voltage generator 1150, control logic 1160, a temperature sensing circuit 1170 and a common source line driver 1180.

The memory cell array 1110 includes a plurality of memory blocks BLK1~BLKz. Each memory block may have a three-dimensional structure (or a vertical structure). In a memory block having a two-dimensional structure, memory cells are formed in a direction parallel to a substrate. In a memory block having a three-dimensional structure, memory cells are formed in a direction perpendicular to a substrate.

The address decoder 1120 is connected to the memory cell array 1110 through select lines (SSL, GSL) or word lines WLs. The address decoder 1120 receives a word line voltage VWL from the voltage generator 1150 and is controlled by the control logic 1160. The address decoder 1120 selects a word line during a program or read operation. A program, verification or read voltage may be provided to the selected word line.

The page buffer circuit 1130 is connected to the memory cell array 1110 through bit lines BLs. The page buffer circuit 1130 may be constituted by a plurality of page buffers (not shown). One bit line is connected to one page buffer but two or more bit lines may be connected to one page buffer. The page buffer circuit 1130 can temporarily store data to be programmed in a selected page or data read from a selected page.

The data input/output circuit 1140 is internally connected to the page buffer circuit 1130 through a data line DL and is externally connected to the memory controller 1200 (refer to FIG. 1) through an input/output line. The data input/output circuit 140 receives program data, Data, from the memory controller 1200 during a program operation and provides read data, Data, to the memory controller 1200 during a read operation.

The voltage generator 1150 receives power PWR from the memory controller 1200 and can generate a word line voltage $V_{WL}$ needed to read or write data. A word line voltage $V_{WL}$ is provided to the address decoder 1120. The voltage generator 1150 can generate a high voltage HV higher than a power supply voltage Vcc. The high voltage HV can be used as a program voltage Vpgm or a pass voltage Vpass during a program operation, as a read voltage Vread during a read operation and as an erase voltage Verase during an erase operation.

The voltage generator 1150 includes a Vpgm generator 1151, a Vvfy generator 1152 and a Vcsl generator 1153. The Vpgm generator 1151 generates a program voltage Vpgm being provided to a selected word line during a program operation. As a program loop proceeds, the program voltage Vpgm may increase. The Vvfy generator 1152 generates a verification voltage Vvfy to verify whether a program operation is succeeded or not after the program voltage Vpgm is provided to every program loop. The verification voltage Vvfy is constituted by a coarse voltage and a fine voltage having a different level from the coarse voltage to be provided to a word line. The Vcsl generator 1153 generates a select line voltage being provided to a string select line SSL or a ground select line GSL and/or a common source line voltage Vcsl being provided to a common source line CSL. For example, one end of cell strings is connected to one another via a common source line CSL, as will be shown in FIG. 5. Although not illustrated in the drawing, the voltage generator 1150 may further include a Vpass generator generating a pass voltage Vpass being provided to select and unselect word lines in a program operation. The pass voltage Vpass is maintained constant even though a program loop proceeds.

According to exemplary embodiments of the disclosure, to increase boosting efficiency, the flash memory device 1100 can reduce power consumption by controlling a level of a voltage which is generated by the Vcsl generator 1153 to be applied to a common source line CSL at every program loop.

The control logic 1160 can control program, read and erase operations of the flash memory 1100 by using a command CMD, an address ADDR and a control signal CTRL being provided from the memory controller 1200. For example, in a program operation, the control logic 1160 can control the address decoder 1120 so that a program voltage Vpgm is provided to a selected word line and can control the page buffer circuit 1130 and the data input/output circuit 1140 so that program data is provided to a selected page.

The temperature sensing circuit 1170 senses a temperature of the periphery and provides a compensation signal CMP compensating a level of a voltage being applied to the memory cell array 1110 to the voltage generator 1150. During a program operation, power consumption can be reduced while increasing boosting efficiency by compensating a level of a voltage being applied to a common source line CSL. If a temperature of the periphery decreases, since a threshold voltage of a transistor increases, a negative compensation voltage may be applied to the common source line CSL. If a temperature of the periphery increases, since a threshold voltage of a transistor decreases, a positive compensation voltage may be applied to the common source line CSL. However, since various different factors besides temperature may affect a threshold voltage of the transistor, an inverse case may occur.

The common source line driver 1180 is connected between the voltage generator 1150 and the memory cell array 1110 to transmit the common source line voltage Vcsl being generated by the Vcsl generator 1153 to the memory cell array 1110. The common source line driver 1180 can ground the common source line CSL. According to a non-volatile memory device in accordance with exemplary embodiments of the disclosure, the common source line CSL is grounded by controlling the common source line driver 1180 in an initial loop of a program (for example, the percentage of cells being inhibited among all memory cells is low) and thereby a level of a voltage being applied to the common source line becomes 0V. As a result, unnecessary power consumption caused by applying a common source line voltage Vcsl of the same level in all the program loop areas can be reduced.

Figure 3:
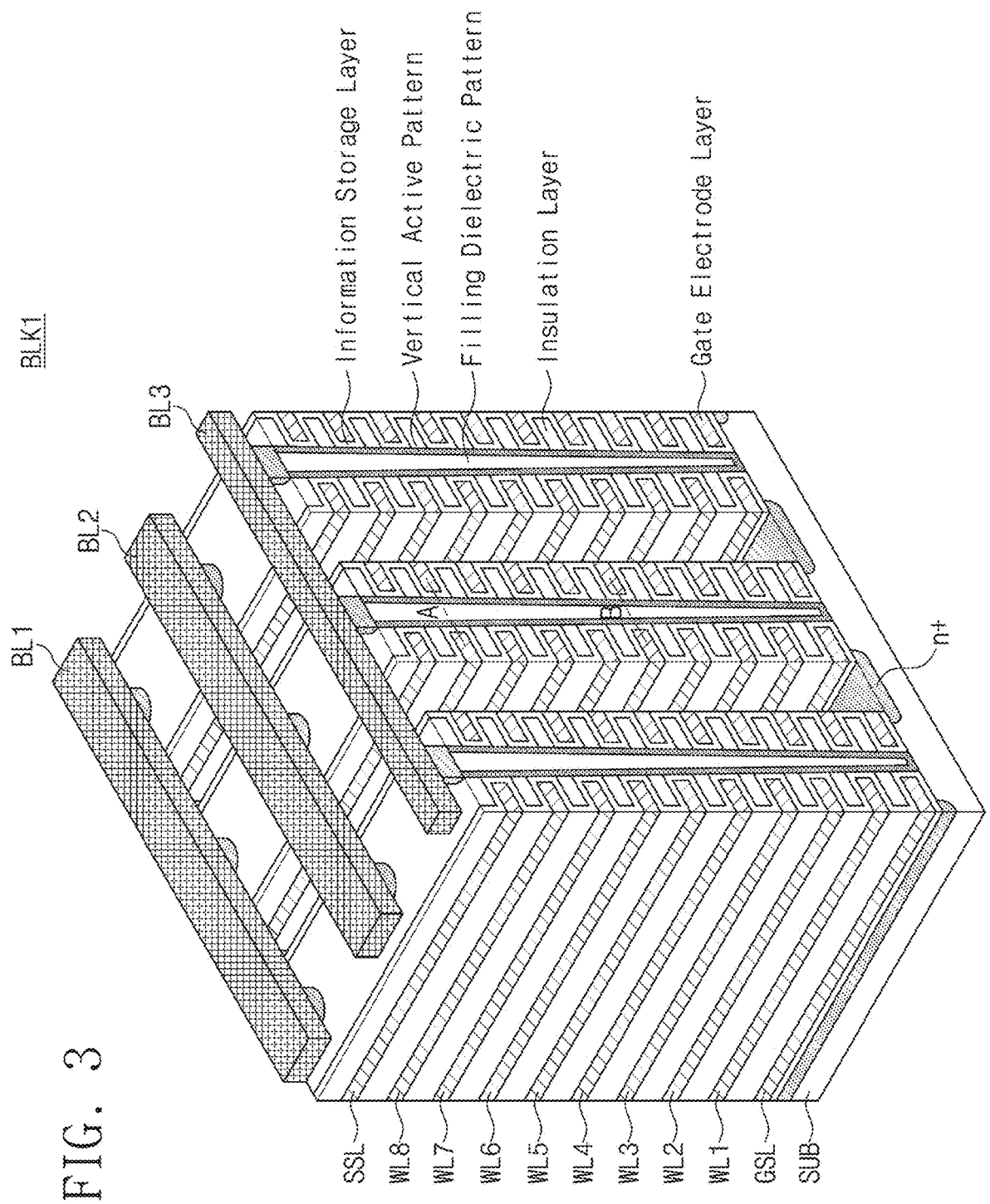
FIG. 3 is a perspective view illustrating an example of a three-dimensional structure of a memory block illustrated in FIG. 2.

FIG. 3 is a perspective view illustrating an example of a three-dimensional structure of a memory block illustrated in FIG. 2. Referring to FIG. 3, a memory block BLK1 is formed in a direction perpendicular to a substrate SUB. An n+ doping region is formed in the substrate SUB.

A gate electrode layer and an insulating layer are alternately deposited on the substrate SUB. An information storage layer may be formed between the gate electrode layer and the insulation layer.

The gate electrode layer and the insulation layer are vertically patterned to form a pillar of a V character shape. The pillar penetrates the gate electrode layer and the insulation layer to be connected to the substrate. The inside of the pillar is a filling dielectric pattern and may be constituted by insulating material such as silicon oxide. The outside of the pillar is a vertical active pattern and may be constituted by a channel semiconductor.

The gate electrode layer of the memory block BLK1 can be connected to a ground select line GSL, a plurality of word lines WL1~WL8 and a string select line SSL. The pillar of the memory block BLK1 can be connected to a plurality of bit lines BL1~BL3. In FIG. 3, one memory block has two select lines SSL and GSL, eight word lines WL1~WL8 and three bit lines BL1~BL3 but the disclosure is not limited to this example.

Figure 4:
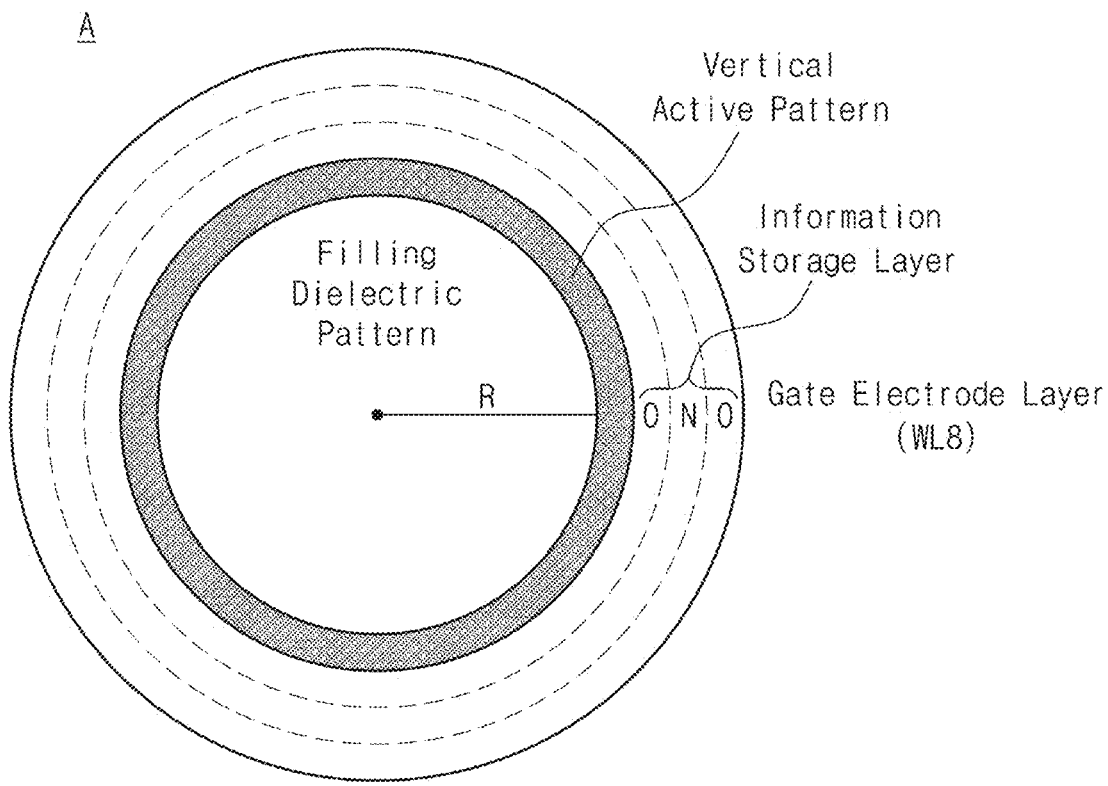
FIG. 4 is a top plan view illustrating A and B cross sections of a memory block illustrated in FIG. 3.
Figure 4:
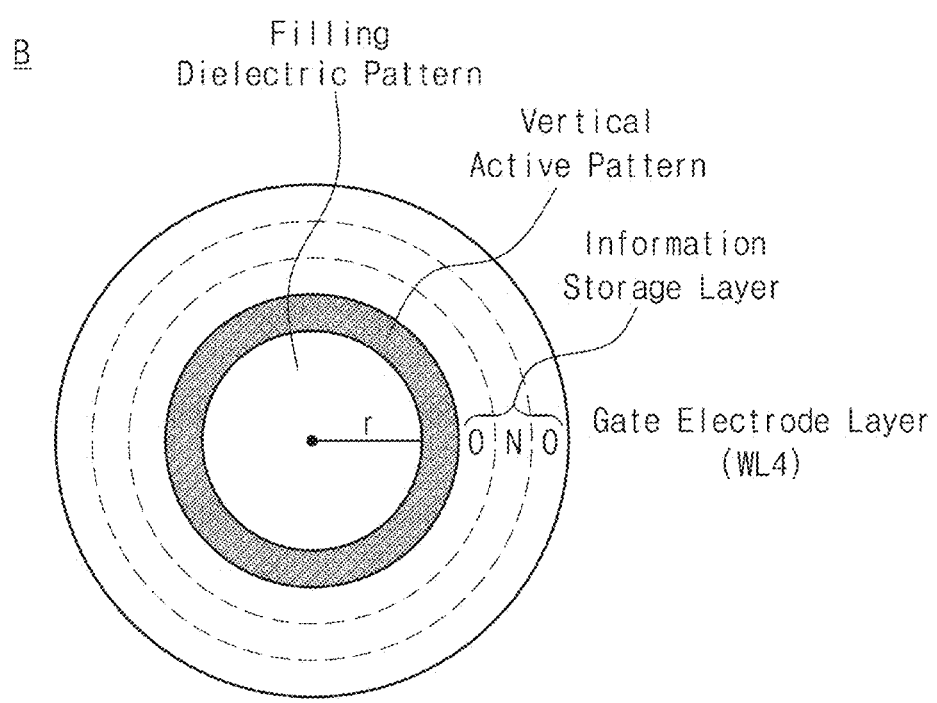

FIG. 4 is a top plan view illustrating A and B cross sections of a memory block illustrated in FIG. 3. The A cross section is a cross sectional view of a plane corresponding to the eighth word line WL8 and the B cross section is a cross sectional view of a plane corresponding to the fourth word line WL4.

In the A and B cross sections, a memory cell may be constituted by a filling dielectric pattern, a vertical active pattern, an information storage layer and a gate electrode layer sequentially from the inside of the pillar. The internal filling dielectric pattern of the pillar may be formed of silicon oxide or air gap. The vertical active pattern may be formed of a P type silicon layer and operates as a channel of a memory cell.

The information storage layer may be constituted by a tunnel insulation layer, a charge storage layer and a blocking insulation layer. The tunnel insulation layer can operate as an insulation layer in which charges move by a tunneling effect. The charge storage layer may be constituted by an insulation layer trapping charges. The charge storage layer may be formed of, for example, a nitride layer SiN or a metal (aluminum or hafnium) oxide layer. The blocking insulation layer can operate as an insulation layer between the gate electrode layer and the charge storage layer. The blocking insulation layer may be formed of a silicon oxide layer. The tunnel insulation layer, the charge storage layer and the blocking insulation layer may be formed by an insulation layer of an oxide-nitride-oxide (ONO) structure.

Referring back to FIG. 3, a three-dimensional flash memory is formed by etching several thin layers at a time to form a hole and forming a silicon channel layer inside the hole. At this time, a diameter of the hole formed through an etching process may become different depending on its depth and may generally become small as approaching the substrate. As illustrated in FIG. 4, a radius R of a filling dielectric pattern corresponding to the eighth word line WL8 is greater than a radius r of a filling dielectric pattern corresponding to the fourth word line WL4.

That phenomenon is due to a difference of etching depth and may become a factor of a characteristic difference of a memory cell connected to the fourth and eighth word lines WL4 and WL8. As a diameter of the pillar becomes great, an effective area of the gate electrode layer is reduced and thereby a resistance of the gate electrode layer becomes high and the capacitance being formed between layers increases. Thus, as a diameter of the pillar increases, coupling capacitance and resistance of a memory cell increase. A resistance R and capacitance C of the eighth word line WL8 located at the upper most layer of the pillar become maximum values.

Memory cells formed at the same height may have a similar cell characteristic. For example, since memory cells connected to the fourth word line WL4 have the same pillar diameter, coupling capacitances and resistances of the memory cells may have similar values.

Figure 5:
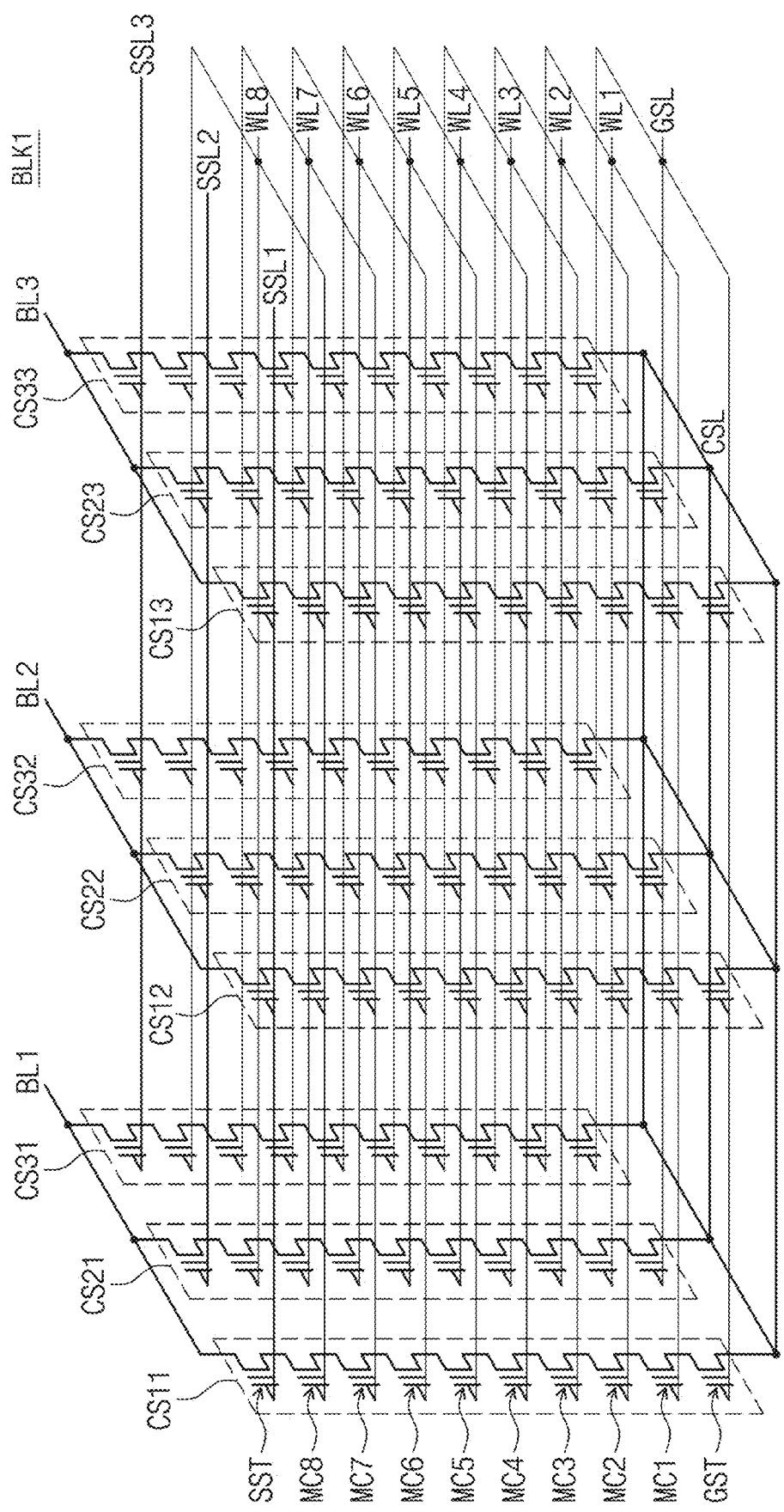
FIG. 5 is an equivalent circuit diagram of the memory block illustrated in FIG. 3.

FIG. 5 is an equivalent circuit diagram of the memory block BLK1 illustrated in FIG. 3. Referring to FIG. 5, cell strings CS11~CS33 are connected between bit lines BL1~BL3 and a common source line CSL. Each cell string (e.g., CS11) includes a ground select transistor GST, a plurality of memory cells MC1~MC8 and a string select transistor SST.

The string select transistor SST is connected to a string select line SSL. The string select line SSL is divided into first through third string select lines SSL1~SSL3. The ground select transistor GST is connected to a ground select line GSL. Ground select lines GSL of the cell strings CS11~CS33 are connected to one another. The string select transistor SST is connected to the bit line BL and the ground select transistor GST is connected to the common source line CSL.

The memory cells MC1~MC8 are connected to respective word lines WL1~WL8. A group of memory cells connected to one word line and programmed at the same time is called a page. The memory block BLK1 is constituted by a plurality of pages. A plurality of pages may be connected to one word line. Referring to FIG. 5, a word line (e.g., WL4) located at the same height from the common source line CSL is connected to three pages in common.

Each memory cell can store one bit data or at least two bit data. A memory cell in which one bit data can be stored in one memory cell is called a single level cell (SLC) or a single bit cell. A memory cell in which at least two bit data can be stored in one memory cell is called a multi level cell (MLC) or a multi bit cell. In the case of a 2 bit MLC, two pages of data is stored in one physical page. Thus, six pages of data can be stored in a memory cell connected to the fourth word line WL4.

In FIG. 5, it is illustrated that each string includes only one string select transistor SST and only one ground select transistor GST. However, in another embodiment, each string may include two or more string select transistors SSTs and two or more ground select transistors GSTs. Additionally, in FIG. 5, it is illustrated that gate electrodes of ground select transistor GSTs are commonly connected to each other. However, in another embodiment, the gate electrodes of the ground select transistor GSTs may not be connected to each other, or only a part of the gate electrodes of the ground select transistor GSTs may be connected to each other.

Figure 6A:
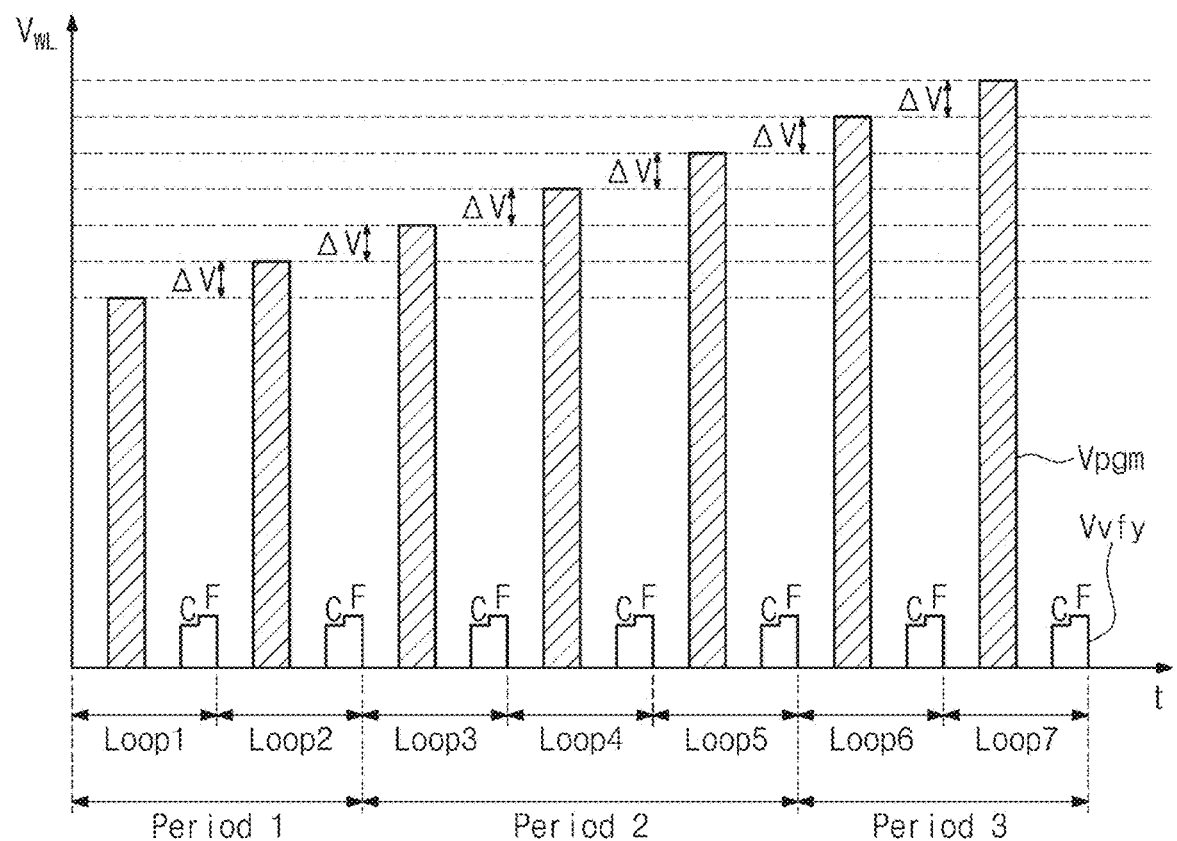
FIG. 6A is a drawing illustrating a voltage being applied to a word line in a program operation in accordance with exemplary embodiments of the disclosure.
Figure 6B:
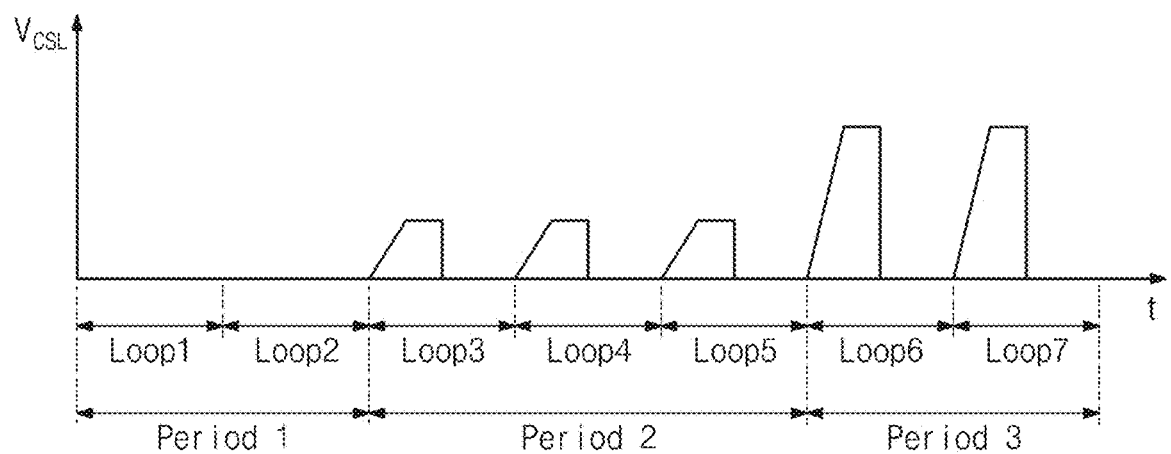
FIG. 6B is a drawing illustrating a voltage being applied to a common source line in a program operation in accordance with exemplary embodiments of the disclosure.

FIG. 6A is a drawing illustrating a voltage being applied to a word line during a program operation in accordance with exemplary embodiments of the disclosure. FIG. 6B is a drawing illustrating a voltage being applied to a common source line CSL during a program operation in accordance with exemplary embodiments of the disclosure. FIGS. 6A and 6B illustrate a program operation with respect to a single level cell (SLC).

Referring to FIG. 6A, a program loop can be performed at least one time (for example, loop 1 through loop 7) which includes a step of applying a program voltage Vpgm and a step of applying a verification voltage Vvfy to program memory cells connected to one selected word line. At this time, the program voltage Vpgm and the verification voltage Vvfy can be generated by the Vpgm generator 1151 (refer to FIG. 2) and the Vvfy generator 1152 (refer to FIG. 2) of the voltage generator 1150 (refer to FIG. 2) respectively. As the loop is repeatedly performed, the program voltage can be increased by a predetermined voltage increment (ΔV). This is called an incremental step pulse programming (ISPP) method. A verification operation being performed at every program loop (for example, loop 1 through loop 7) may include a first verification operation and a second verification operation. For example, the first verification operation may be a coarse verification operation, C, and the second verification operation may be a fine verification operation, F. However, the verification operation is not limited thereto. The verification operation may be performed only once at every loop.

According to exemplary embodiments of the disclosure, all the program loops (for example, loop 1 through loop 7) can be divided into a plurality of periods (for example, first through third periods) including at least one program loop. To increase boosting efficiency when each program operates, unnecessary power consumption can be reduced by making a voltage level being applied to a common source line CSL different at every period. For example, at an initial loop (e.g., loop 1 or a loop near the loop 1), since most of the memory cells connected one word line will be programmed, the percentage of cells being inhibited is low. That is, the percentage of bit lines whose voltages are boosted to a power supply voltage (e.g., 8V) among bit lines connected to memory cells is low. In this case, since the percentage of bit lines being boosted is low, if a voltage of the common source line CSL is maintained at a specific level to increase boosting efficiency at that program loop, this may cause unnecessary power consumption.

Thus, among all the program periods for programming memory cells connected to one word line, at an initial period (for example, period 1 or periods 1 and 2) in which the percentage of cells being inhibited is low, a voltage of the common source line CSL is maintained at 0V. As a program loop proceeds, a level of a voltage being applied to the common source line CSL increases and thereby unnecessary power consumption can be prevented. A reference point by which all the program loops are divided into a plurality of periods may be determined by a memory vendor in a memory production stage. For example, all the program loops may be divided so that program loops in which the percentage of memory cells being inhibited is lower than 10% may belong to the period 1, program loops in which the percentage of memory cells being inhibited is higher than 10% and lower than 80% may belong to the period 2 and program loops in which the percentage of memory cells being inhibited is higher than 80% may belong to the period 3. The percentage of memory cells being inhibited, which is a reference point of division, is not limited to this example. The number of periods being divided is also not limited to this example.

Referring to FIG. 6B, FIG. 6B illustrates a voltage level being applied to the common source line CSL while programming memory cells connected to one word line. Assume that seven loops are performed to program one word line and the seven loops are divided into three periods. As described above, the number of periods is determined according to the percentage of memory cells being inhibited among all the memory cells. The percentage of memory cells that defines a boundary between periods may be arbitrarily determined by a memory vendor in a memory production stage. It may also be determined by firmware in an end user stage. A voltage being applied to the common source line CSL can be applied from when each loop begins until a supply of a program voltage Vpgm is cut off. After that, in a section in which a verification voltage Vvfy is applied, a voltage being applied to the common source line CSL may be 0V.

The period 1 means a section in which the percentage of memory cells being inhibited is low. This means that there is less need to boost bit lines connected to unselect memory cells. For example, if the percentage of memory cells being inhibited among all the memory cells is lower than 10%, loops (for example, loop 1 and loop 2) corresponding to that case may be included in the period 1. Program errors that may occur because a boosting does not properly operate by keeping a voltage level of the common source line CSL 0V can be corrected by the separate error correction circuit 1250 (refer to FIG. 1). That is, there is a trade-off between a voltage level control of the common source line CSL and an error occurrence.

The period 2 is a section in which there is increasingly a need to boost bit lines connected to program inhibit memory cells because the percentage of memory cells being inhibited becomes higher while a program operation is continuously performed. For example, if the percentage of memory cells being inhibited among all the memory cells is higher than 10% and lower than 80%, loops (for example, loop 3, loop 4 and loop 5) corresponding to that case may be included in the period 2.

The period 3 is a section in which the percentage of memory cells being inhibited is high because a program operation is performed on most of the memory cells connected to one word line. That is, the period 3 means a section that most of the memory cells are programmed and thereby there is increasingly a need to boost bit lines connected to memory cells to be program inhibited. For example, if the percentage of memory cells being inhibited among all the memory cells is higher than 80%, loops (for example, loop 6 and loop 7) corresponding to that case may be included in the period 3. In the period 3, a voltage level being applied to the common source line CSL may be 1.0V~1.5V, but the disclosure is not limited to this example.

As described above, when a program operation is performed on one word line, according to the percentage of memory cells being inhibited, unnecessary power consumption can be prevented by controlling a level of a voltage being to the common source line CSL.

Figure 7A:
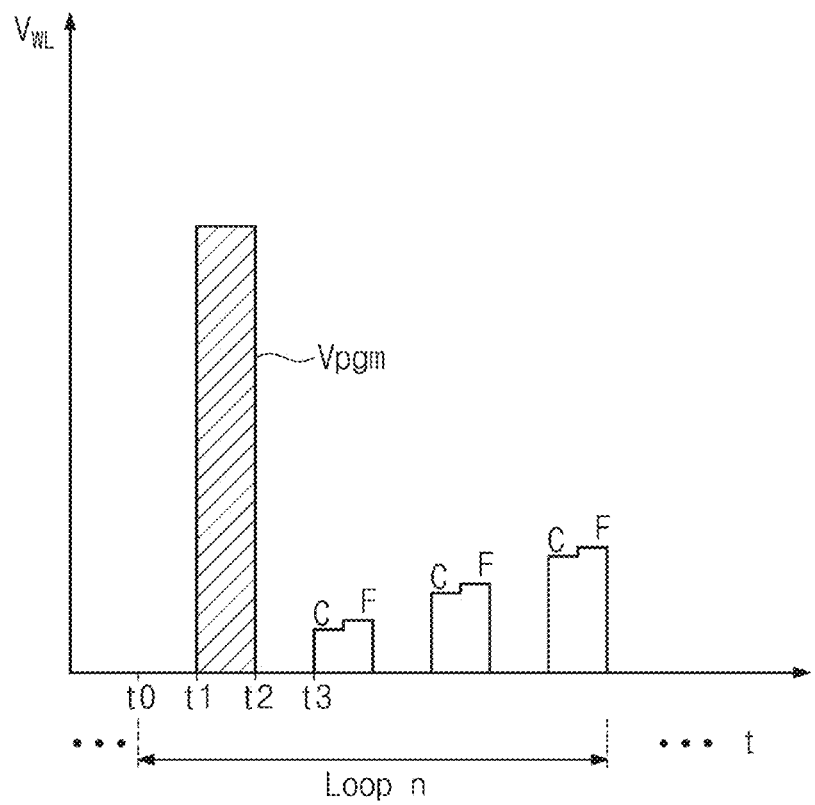
FIG. 7A is a drawing illustrating a voltage being applied to a word line when a program operation is performed on a multi level cell.
Figure 7B:
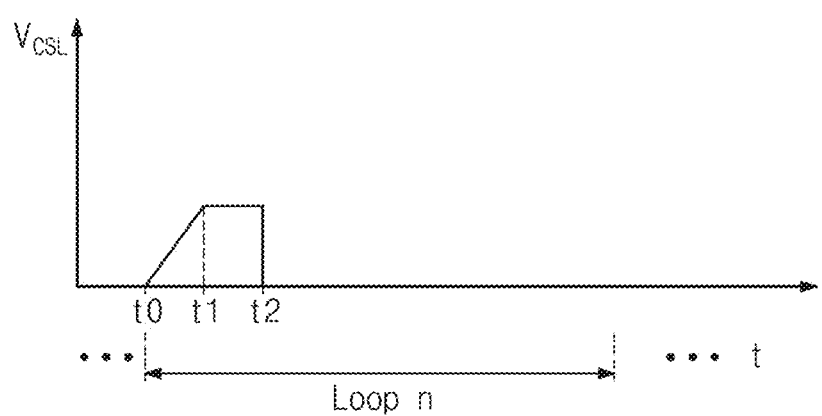
FIG. 7B is a drawing illustrating a voltage being applied to a common source line in a program operation in accordance with exemplary embodiments of the disclosure.

FIG. 7A is a drawing illustrating a voltage being applied to a word line when a program operation is performed on a multi level cell in accordance with exemplary embodiments of the disclosure. FIG. 7B is a drawing illustrating a voltage being applied to a common source line CSL in a program operation in accordance with exemplary embodiments of the disclosure.

Referring to FIGS. 7A and 7B, an arbitrary loop n is illustrated among a plurality of loops needed to program memory cells connected to one word line. As described in FIG. 6A, program voltages Vpgm being applied to a word line at every program loop may increase by a predetermined voltage increment (e.g., ΔV) according to an ISPP method. A voltage being applied to the common source line CSL can be applied from the time t0 when each loop begins until the time t2 when a supply of the program voltage Vpgm is cut off. After that, in a section after the time t3 when a verification voltage Vvfy begins to be applied, a voltage being applied to the common source line CSL may be 0V. While a program operation is performed on a multi level cell MLC, since a method of reducing power consumption by controlling a voltage level being applied to the common source line CSL is similar to that of a single level cell SLC, the detailed description is omitted.

Figure 8A:
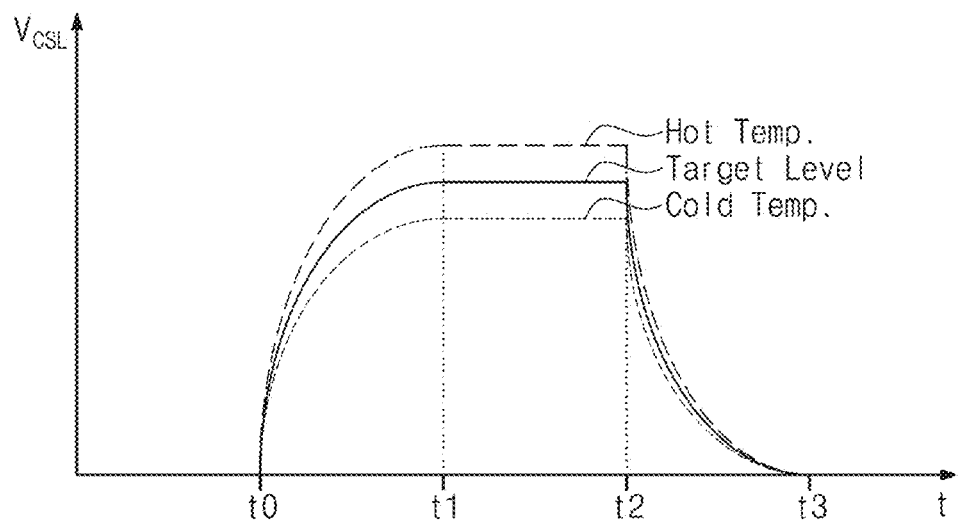
FIGS. 8A, 8B and 8C are drawings illustrating examples of a voltage level applied to a common source line in one loop when a program operation is performed.
Figure 8B:
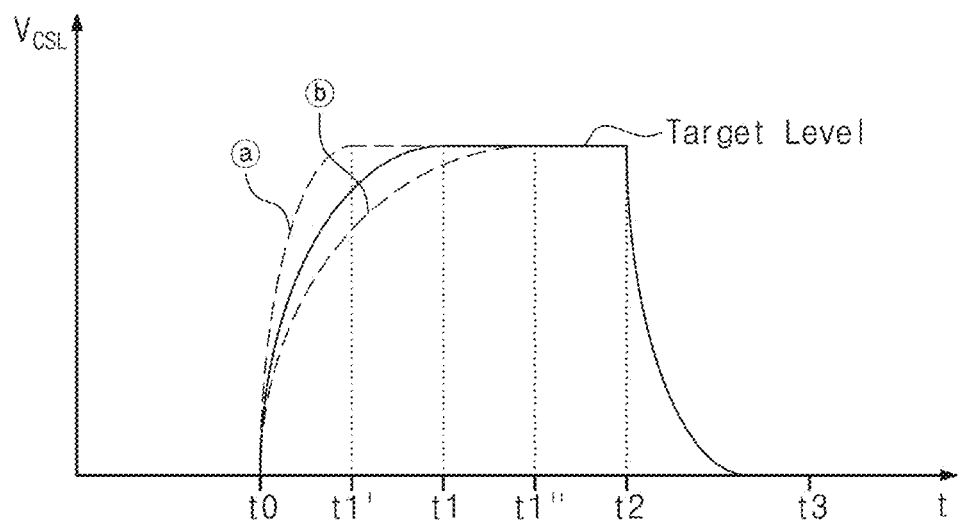
Figure 8C:
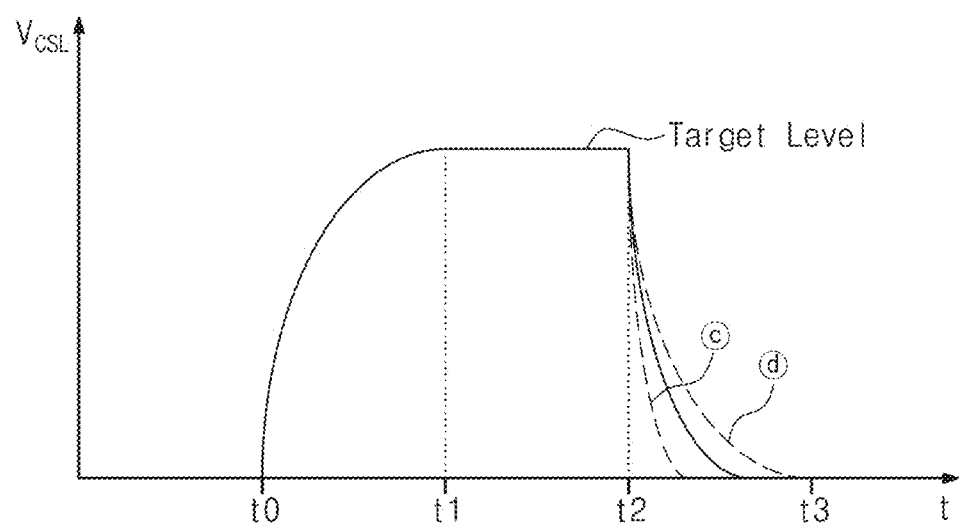

FIGS. 8A, 8B and 8C are drawings illustrating examples of a voltage level applied to a common source line CSL in one loop when a program operation is performed. A section of t0~t1 is a set up section, a section of t1~t2 is a section of applying a program voltage to memory cells connected to a word line and a section of t2~t3 is a standby section to execute a program verification step.

At time t0, a program verification step of a previous loop is finished and a new program loop begins. The section of t0~t1 is a setup section and a voltage being applied to the common source line CSL is gradually increased to minimize an effect that may exert on a memory cell in the section of t0~t1. Although a level of a common source line voltage Vcsl being applied to the common source line CSL is gradually increased, the voltage level may increase in the form of an inverse exponential function as illustrated in the drawing by a parasitic capacitance being formed between the common source line CSL and a bit line, between the common source line CSL and a word line or between the common source line CSL and a channel. This means that a current is needed to precharge a parasitic capacitance. The section of t1~t2 is a section that a program voltage Vpgm is applied to a word line and at this time, a voltage of the common source line CSL reaches a target level. Since a verification voltage Vvfy for judging whether a program is succeeded or not is applied to a word line from time t3, the voltage of the common source line CSL has to be completely grounded in the section of t2~t3.

Because a threshold voltage of a transistor constituting a semiconductor device is changed by a peripheral temperature, it is necessary to compensate the threshold voltage. Generally, if a peripheral temperature increases (e.g., Hot Temperature), a threshold voltage of a transistor is reduced. Thus, it is necessary to increase a level of a voltage being applied to the common source line CSL. If a peripheral temperature decreases (e.g., Cold Temperature), a threshold voltage of a transistor is increased. Thus, it is necessary to lower a level of a voltage being applied to the common source line CSL. The temperature sensing circuit 1170 (refer to FIG. 2) senses a peripheral temperature to transmit, to the voltage generator 1150 (refer to FIG. 2), a compensation signal CMP (refer to FIG. 2) that controls so that a level of a voltage being applied to the common source line CSL is compensated. A common source line voltage Vcsl compensated by the compensation signal CMP can be supplied to the common source line CSL of the memory cell array 1110 (refer to FIG. 2) through the common source line CSL driver 1180 (refer to FIG. 1180).

Referring to FIG. 8B, a slope of the setup section (t0~t1) can be controlled by gradually increasing a voltage being applied to the common source line CSL. In the case of a VNAND flash memory, since memory cells are vertically stacked on a substrate, it may be greatly affected by a parasitic capacitance compared with a general NAND flash memory. As described above, a parasitic capacitance may be formed between the common source line CSL and a bit line, between the common source line CSL and a word line or between the common source line CSL and a channel. A parasitic capacitance being formed between the common source line CSL and a bit line may affect a sensing operation and a recovery operation. A parasitic capacitance being formed between the common source line CSL and a word line may affect program disturb. In the case that a voltage level of the common source line CSL is rapidly increased, power noise may occur. Thus, to prevent that the parasitic capacitance is rapidly increased to affect a memory device, a slope of the setup section is controlled (e.g., (a) or (b)) by controlling a speed that the Vcsl generator 1153 (refer to FIG. 2) applies a voltage to the common source line CSL.

Referring to FIG. 8C, immediately after a program voltage is applied in a section t1~t2, a voltage being applied to the common source line CSL can be slowly reduced in a section t2~t3. Although a power supply voltage is cut off in the section t2~t3, because of an effect of a parasitic capacitance, a voltage of the common source line CSL is reduced in the form of an exponential function. Thus, to reduce an effect that may exert on a sensing operation, a recovery operation or a program disturb, a speed that a voltage level of the common source line CSL is reduced is controlled. For example, the control logic 1160 (refer to FIG. 2) can control the time that a level of the common source line voltage Vcsl is grounded (for example, (c) or (d)) by controlling the Vcsl generator 1153 generating the common source line voltage Vcsl being applied to the common source line CSL through the common source line driver 1180.

Figure 9:
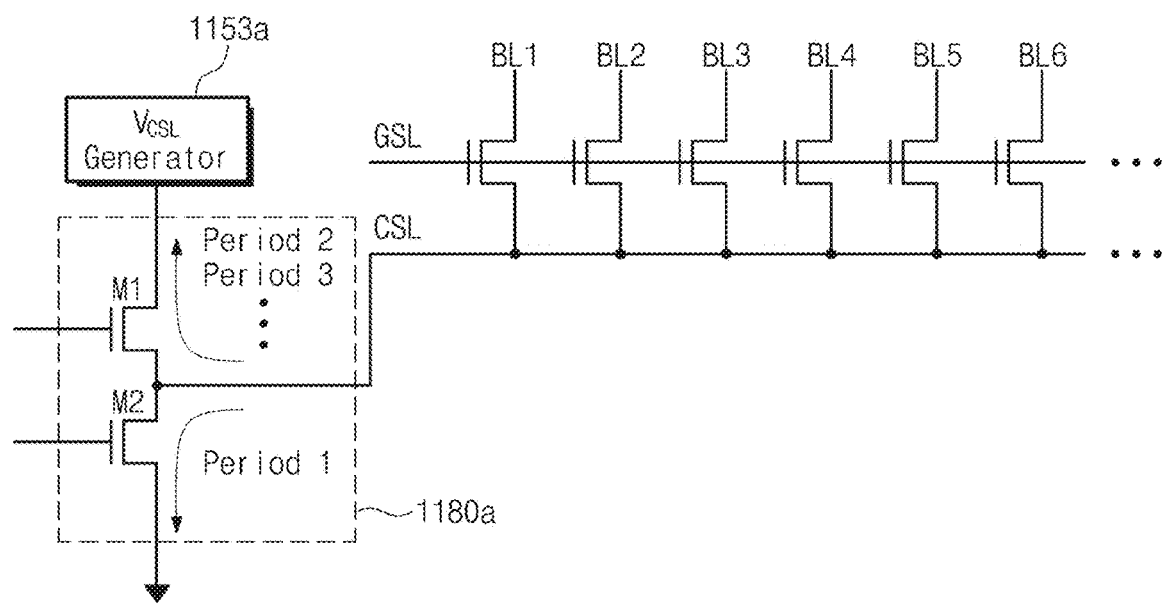
FIG. 9 is a drawing illustrating a common source line driver in accordance with exemplary embodiments of the disclosure.

FIG. 9 is a drawing illustrating a common source line driver in accordance with exemplary embodiments of the disclosure. For example, common source line driver 1180a may be an exemplary embodiment of a common source line driver 1180 illustrated in FIG. 2. The common source line driver 1180a transmits common source line voltage Vcsl generated by the Vcsl generator 1153a to the common source line CSL or grounds the common source line CSL. For example, the common source line driver 1180a may be constituted by two transistors M1 and M2. As illustrated in the drawing, a drain electrode of the pull-up transistor M1 may be connected to the Vcsl generator 1153a and a source electrode of the pull-up transistor M1 may be connected to a common source line CSL. A drain electrode of the pull-down transistor M2 may be connected to the source electrode of the pull-up transistor M1 and a source electrode of the pull-down transistor M2 may be connected to a ground electrode.

For example, during a program operation, in the case that the percentage of memory cells being inhibited among all the memory cells is low and thereby there is less need to increase boosting efficiency (the period 1 of FIGS. 6A and 6B), the pull-up transistor M1 is turned off and the pull-down transistor M2 is turned on and thereby the common source line CSL can be grounded. In the case that as a program loop is repeated, the percentage of memory cells being inhibited becomes high and thereby there is increasingly a need to increase boosting efficiency (the periods 2 and 3), the pull-up transistor M1 is turned on and the pull-down transistor M2 is turned off and thereby the common source line CSL is connected to common source line voltage Vcsl. As the number of times the program loop is executed increases, the percentage of memory cells being inhibited becomes high and there is increasingly a need to increase boosting efficiency in a program operation. Thus, as the number of times the program loop is executed increases, a voltage level of the common source line CSL may increase.

The common source line CSL may be electrically floated by turning off both the pull-up transistor M1 and the pull-down transistor M2 of the common source line driver 1180a.

Furthermore, the Vcsl generator 1153a may provide at least two different voltage levels to the pull-up transistor M1 that the common source line driver 1180a may apply to the common source line CSL.

According to exemplary embodiments of the disclosure, a voltage level of the common source line CSL can be changed according to the percentage of memory cells being inhibited among all the memory cells while increasing a voltage level of the common source line CSL in stages from 0V to increase boosting efficiency in a program operation. That is, in the case of a program initial loop in which the percentage of memory cells being inhibited is low, a voltage level of the common source line CSL is lowered or grounded and in the case of a program loop in which the percentage of memory cells being inhibited is high, a voltage level of the common source line CSL is increased. By doing this, charge-discharge power of the common source line CSL that occupies 10~15% of program power consumption of a VNAND flash memory device can be reduced by about 50%.

Figure 10:
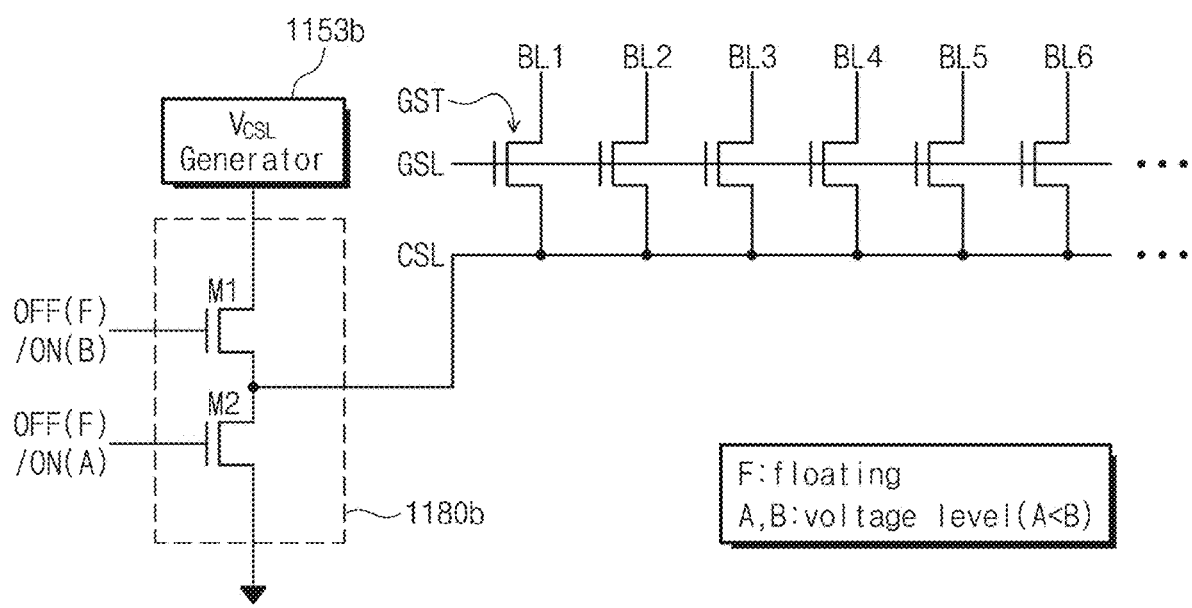
FIG. 10 is a diagram illustrating a common source line voltage being applied to a common source line in a program operation in accordance with an embodiment of the disclosure.

FIG. 10 is a diagram illustrating a common source line voltage $V_{CSL}$ being applied by $V_{CSL}$ generator 153b to a common source line CSL in a program operation in accordance with an embodiment of the disclosure. For example, common source line driver 1180b may be an exemplary embodiment of a common source line driver 1180 illustrated in FIG. 2.

Referring to FIG. 10, a common source line CSL may be electrically floated while a programming voltage is applied on a selected word line. Both pull-up transistor M1 and pull-down transistor M2 of common source line driver 1180b may be turned off to establish the floating state of the common source line CSL.

While the common source line CSL is in a floating state, some programming leakage may flow into the common source line CSL and thus the voltage level of the common source line CSL may be slightly increased. Once the voltage level of the common source line CSL is increased, a negative gate-source bias condition is established on the ground selection transistor GST and additional inflow of leakage current to the common source line CSL is limited.

Because the common source line voltage driver 1180b does not drive the common source line CSL, current consumption required to charge and discharge the common source line CSL may be saved.

After each programming operation of programming loops, a verify operation follows. During the verify operation, each of the memory cells being programmed is determined to be program passed or not. For the memory cells not passed, additional programming and verify sequences are continued. The common source line CSL may receive the ground voltage to perform a verify operation for the memory cells being programmed.

During an additional programming sequence, the program not-passed memory cells are programmed with a second programming voltage and a corresponding bit line voltage may receive a programming voltage for continuing the programming operation. On the contrary, the program passed memory cells are excluded from following program operations by biasing a corresponding bit line voltage to a ground voltage.

In FIG. 10, it is illustrated that a voltage level B to turn-on the pull-up transistor M1 is smaller than a voltage level A to turn-on the pull-down transistor M2. However, in another embodiment, the voltage level A may be greater than or equal to the voltage level B.

FIGS. 11A to 11D are diagrams illustrating a common source line voltage being applied to a common source line in a program operation in accordance with an embodiment of the disclosure.

Figure 11A:
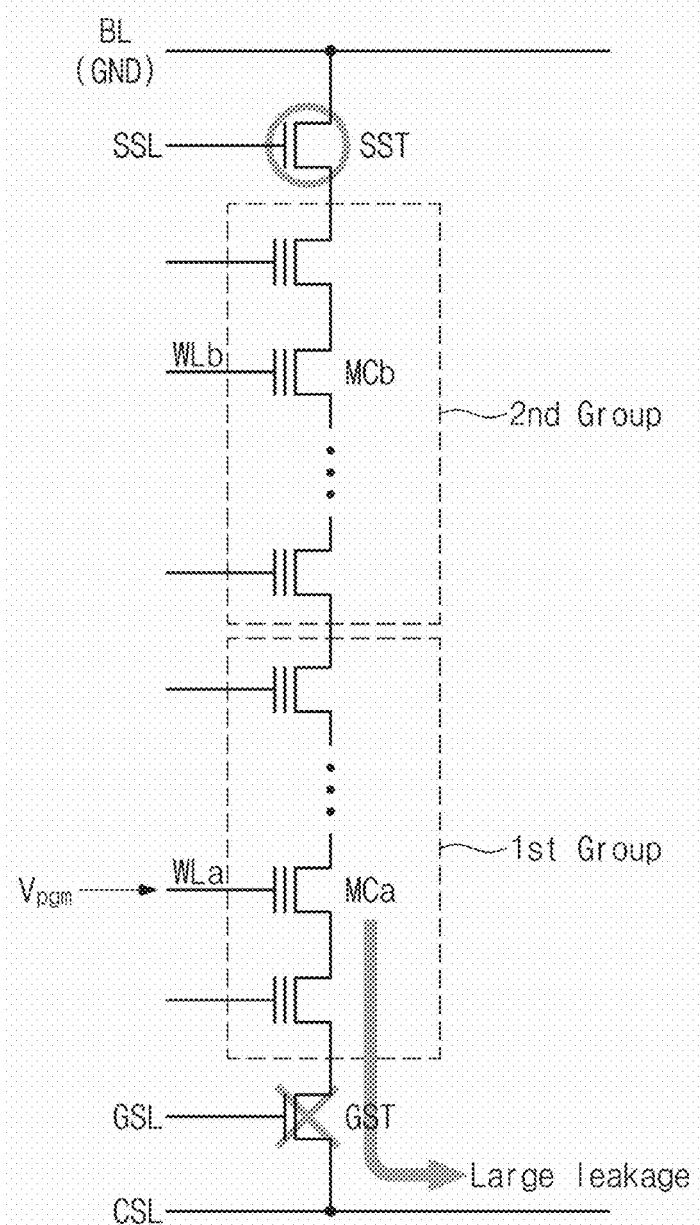
FIGS. 11A to 11D are diagrams illustrating a common source line voltage being applied to a common source line in a program operation in accordance with an embodiment of the disclosure.

Referring to FIG. 11A, each string of vertical memory cells may be divided into several groups depending on the location of the memory cells with respect to the common source line. For example, in FIG. 11A, it is illustrated that memory cells are divided into two groups. However, embodiments of the disclosure may not be limited thereto.

A first group of memory cells may be defined to be closer to the common source line CSL than a second group of memory cells. Likewise, a first word line group may be defined to include word lines connected to the first group of memory cells and a second word line group may be defined to include word lines connected to the second group of memory cells. The first word line group and the second word line group may be biased differently during a programming operation to balance the leakage current flowing into the common source line CSL and the common source line charging current.

Figure 11B:
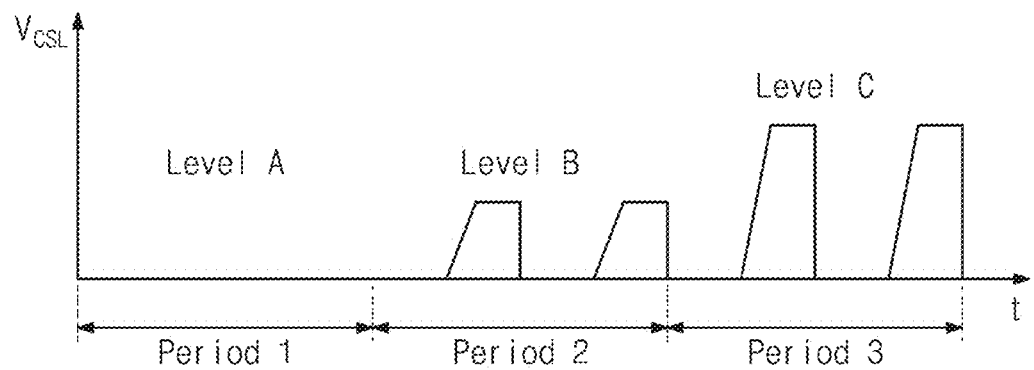

In one embodiment, referring to FIGS. 11A and 11B, the more the program loops are executed, the larger the level of the common source line voltage $V_{CSL}$. This scheme is described in detail in FIG. 6B, thus detailed descriptions are omitted here. However, unlike an embodiment in FIG. 6B, the level of the common source line voltage $V_{CSL}$ is variable depending on which group the memory cell being programmed belongs.

For example, when a word line WLa is selected to program a memory cell MCa included in the first group, the leakage current flowing into the common source line CSL may be relatively large because the distance between the programming cell MCa and the common source line CSL may be relatively short. Because of the relatively large current, relatively large levels of the common source line voltage $V_{CSL}$ (e.g., Level B and Level C) may be applied on the common source line CSL to reduce the leakage current flowing into the common source line CSL. The common source line voltage $V_{CSL}$ may be increased as the programming loops are continued to minimize the common source line charging current.

In contrast, when a word line WLb is selected to program a memory cell MCb belonging to the second group of memory cells, relatively small levels of common source line voltages may be applied to the common source line CSL. This will be described in detail in FIGS. 12A and 12B.

Figure 11C:
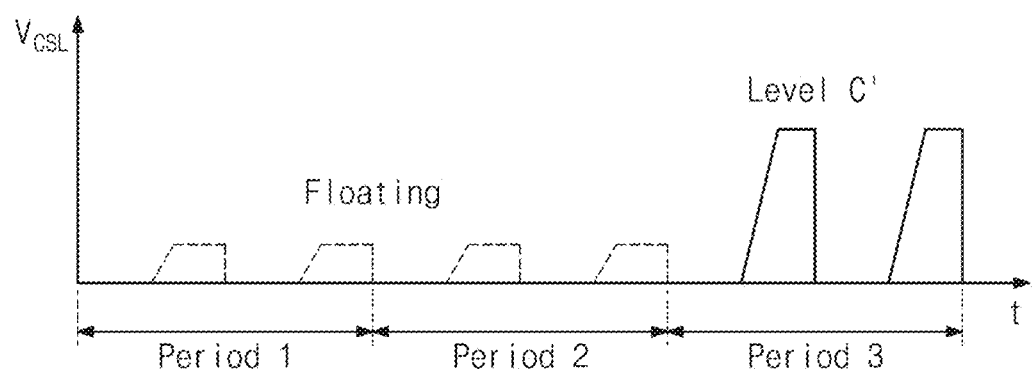

In another embodiment, referring to FIGS. 11A and 11C, the common source line CSL may be floated during initial programming loops, for example, which belong to period 1 or period 2, to reduce current consumption by eliminating charging and discharging of the common source line CSL. As the programming loops are repeated, the number of memory cells that pass the verify operation is increased and thus the number of program inhibit cells are increased which results in the increase of leakage current that may flow into the common source line CSL. For evading such an undesirable leakage current, common source line voltage $V_{CSL}$ (e.g., Level C') may be applied on the common source line CSL during later programming loops, for example, which belong to period 3. The common source line voltage $V_{CSL}$ may establish a negative gate-source bias on the ground selection transistor GST and may reduce the leakage current flowing into the common source line CSL.

Figure 11D:
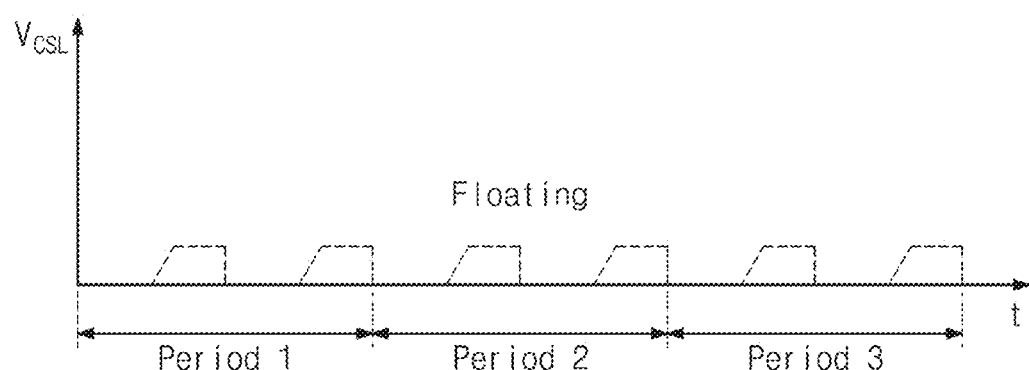

Referring to FIGS. 11A and 11D, for another embodiment, the common source line CSL may be floated during all programming loops.

FIGS. 12A to 12D are diagrams illustrating a common source line voltage $V_{CSL}$ being applied to a common source line in a program operation in accordance with an embodiment of the disclosure.

Figure 12A:
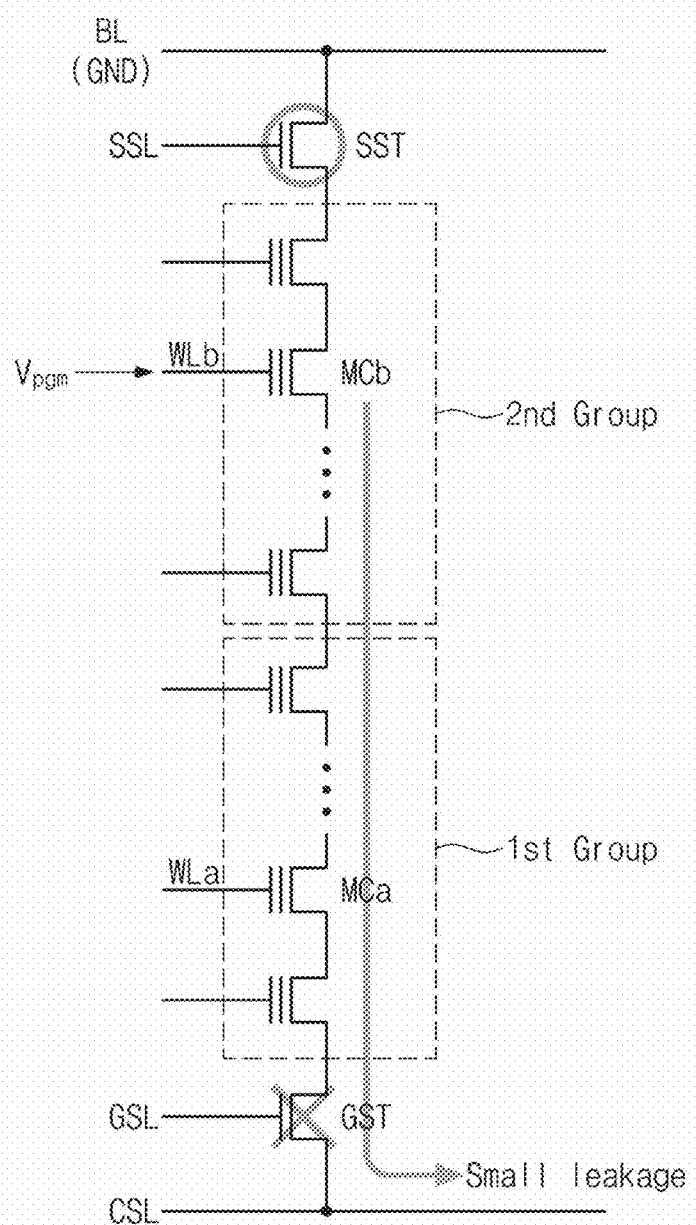
FIGS. 12A to 12D are diagrams illustrating a common source line voltage being applied to a common source line in a program operation in accordance with an embodiment of the disclosure.
Figure 12B:
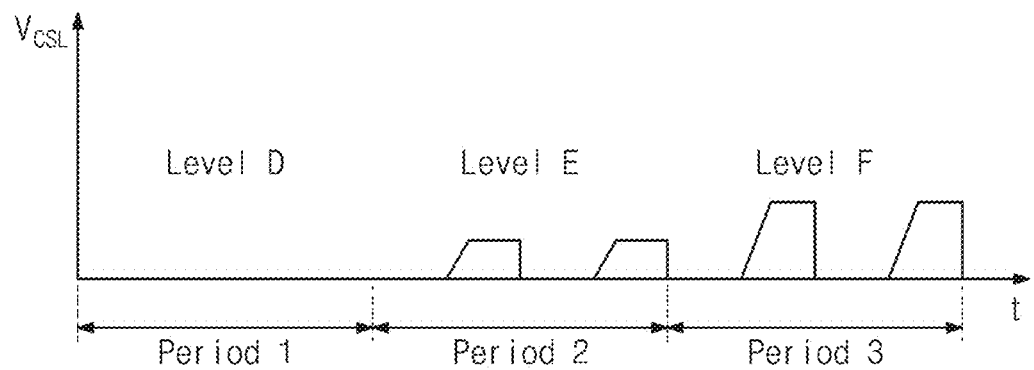

In one embodiment, referring to FIGS. 12A and 12B, the more program loops are executed, the larger the level of the common source line voltage $V_{CSL}$. However, unlike an embodiment in FIG. 11B, relatively small levels of common source line voltages (e.g., Level E and Level F) may be applied to the common source line CSL. For example, level E is smaller than level B illustrated in FIG. 11B and level F is smaller than level C illustrated in FIG. 11B.

Figure 12C:
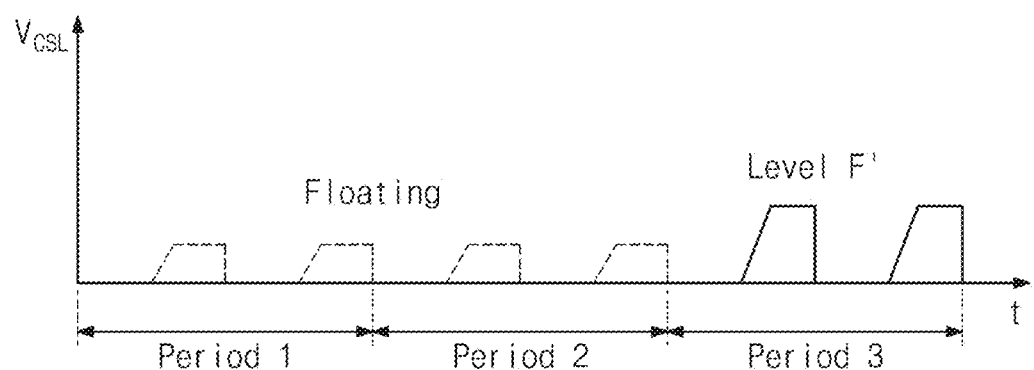

In another example, referring to FIGS. 12A and 12C, the common source line CSL may be floated during initial programming loops, for example, which belong to period 1 or period 2. For evading an undesirable leakage current, common source line voltage $V_{CSL}$ (e.g., Level F') may be applied on the common source line CSL during later programming loops. For example, Level F' is smaller that Level C' illustrated in FIG. 11C.

Figure 12D:
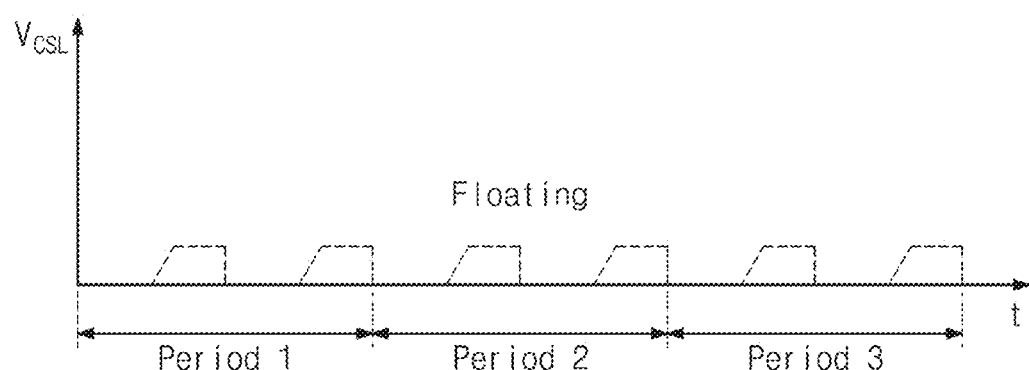

In another example, referring to FIGS. 12A and 12D, when a word line WLb is selected to program a memory cell MCb included in the second group, the leakage current flowing into the common source line CSL may be relatively small because the distance between the programming cell MCb and the common source line CSL may be relatively long. Because of the small leakage current, the common source line CSL may be electrically floated to reduce the common source line charging current.

Figure 13:
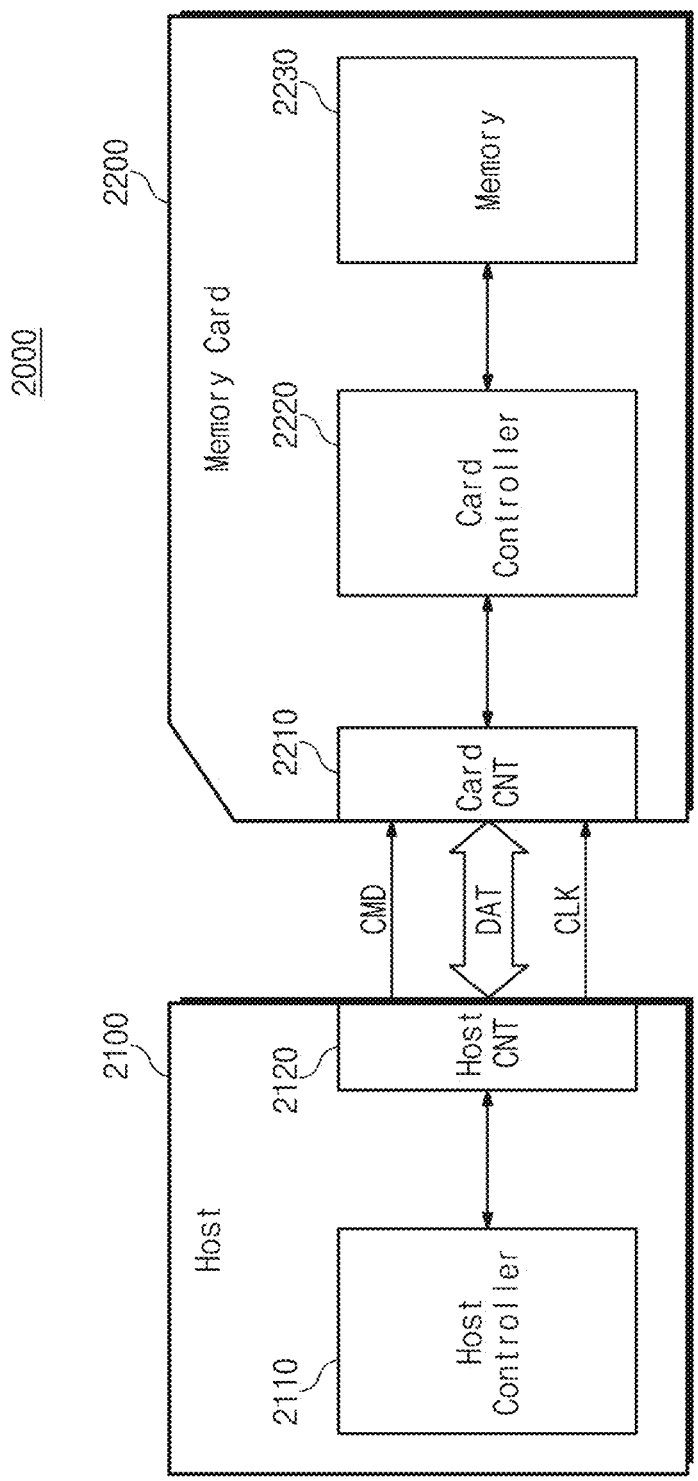
FIG. 13 is a block diagram illustrating an example that a data storage device in accordance with exemplary embodiments of the disclosure is applied to a memory card.

FIG. 13 is a block diagram illustrating an example in which a data storage device in accordance with exemplary embodiments of the disclosure is applied to a memory card.

A memory card system 2000 includes a host 2100 and a memory card 2200. The host 2100 includes a host controller 2110 and a host connection unit 2120. The memory card 2200 includes a card connection unit 2210, a card controller 2220 and a flash memory 2230. The flash memory 2230 is embodied by the three-dimensional (3D) flash memory described above.

The host 2100 writes data in the memory card 2200 or reads data stored in the memory card 2200. The host controller 2110 transmits a command CMD (e.g., a write command), a clock signal CLK generated from a clock generator in the host 3100 and data, DAT, to the memory card 2200 through the host connection unit 2120.

The card controller 2220 stores data in the flash memory 2230 in synchronization with a clock signal CLK generated from a clock generator in the card controller 2220 in response to a write command CMD received through the card connection unit 2210. The flash memory 2230 stores data transmitted from the host 2100. In the case that the host 2100 is a digital camera, the flash memory stores image data.

Figure 14:
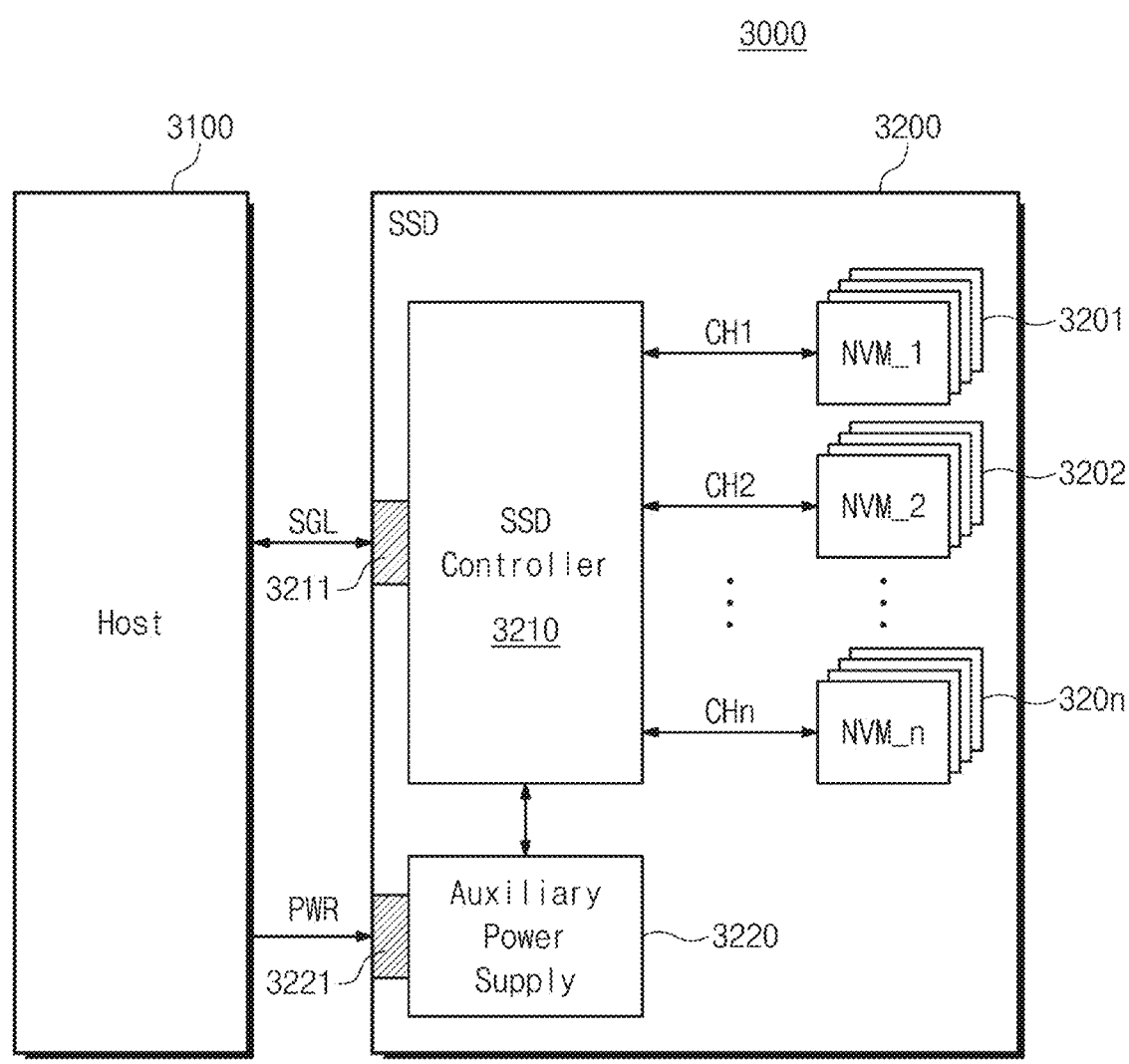
FIG. 14 is a block diagram illustrating an example that a data storage device in accordance with exemplary embodiments of the disclosure is applied to a solid state drive.

FIG. 14 is a block diagram illustrating an example in which a data storage device in accordance with exemplary embodiments of the disclosure is applied to a solid state drive SSD. Referring to FIG. 14, an SSD system 3000 includes a host 3100 and an SSD 3200.

The SSD 3200 exchanges a signal SGL with the host 3100 through a signal connector 3211 and receives power PWR through a power connector 3221. The SSD 3200 may include a plurality of flash memories 3201~320n, an SSD controller 3210 and an auxiliary power supply 3220.

The flash memories 3201~320n are used as a storage medium of the SSD 3200. A nonvolatile memory device such as PRAM, MRAM, ReRAM, FRAM, etc. besides the flash memory can be used as a storage medium of the SSD 3200. The flash memories 3201~320n can be connected to the SSD controller 3210 through a plurality of channels CH1~CHn. One or more flash memories can be connected to each channel. Flash memories connected to each channel can be connected to the same data bus.

The SSD controller 3210 exchanges a signal SGL with the host 3100 through the signal connector 3211. The signal SGL includes a command, an address, data, etc. The SSD controller 3210 writes data in a corresponding flash memory or reads data from a corresponding flash memory according to a command of the host 3100.

The auxiliary power supply 3220 is connected to the host 3100 through the power connector 3221. The auxiliary power supply 3220 can receive power from the host 3100 to charge it. The auxiliary power supply 3220 can be located inside or outside the SSD 3200. For example, the auxiliary power supply 3220 is located on a main board and can provide auxiliary power to the SSD 3200.

Figure 15:
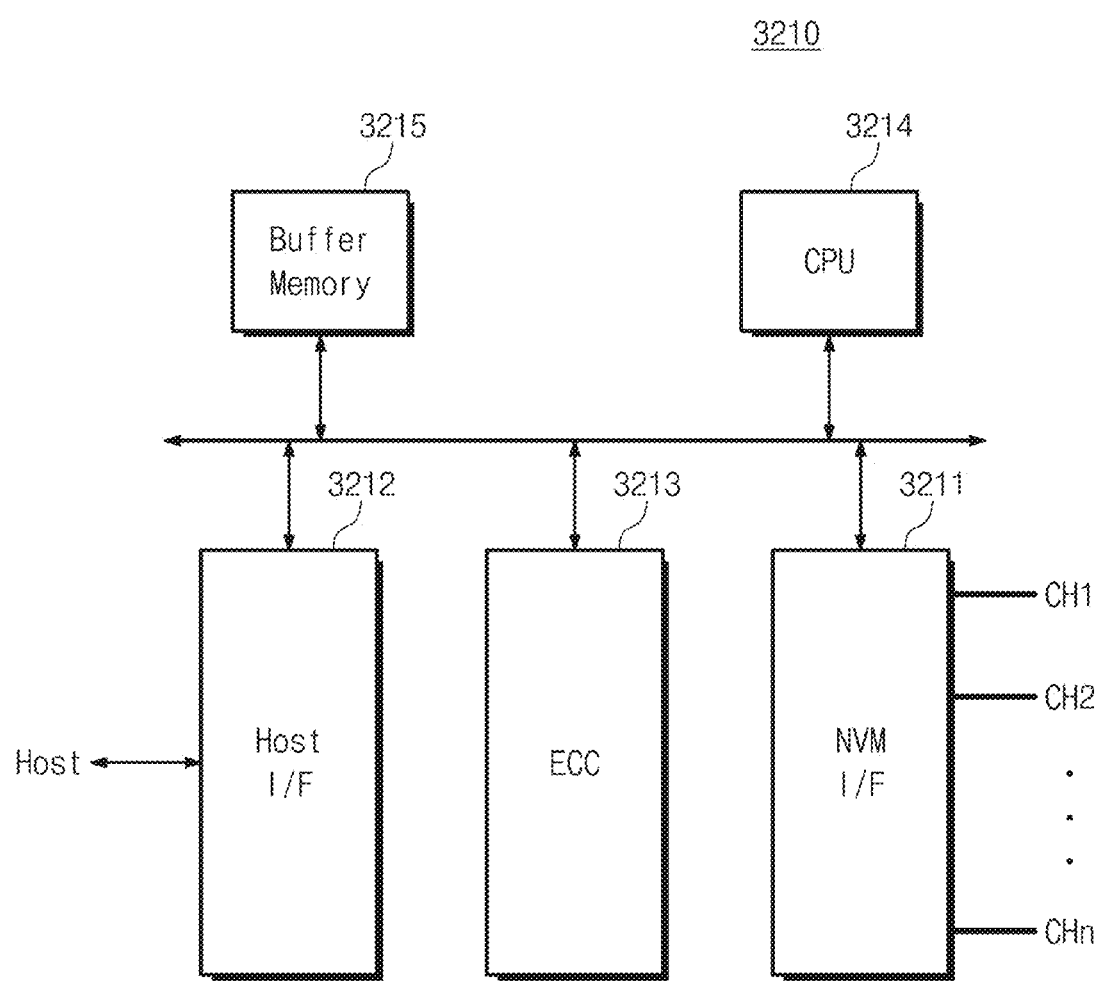
FIG. 15 is a block diagram illustrating an example of a constitution of an SSD controller illustrated in FIG. 14.

FIG. 15 is a block diagram illustrating a constitution of an SSD controller illustrated in FIG. 14. Referring to FIG. 15, the SSD controller 3210 includes an NVM interface 3211, a host interface 3212, an ECC circuit 3213, a central processing unit (CPU) 3214 and a buffer memory 3215.

The NVM interface 3211 scatters data transmitted from the buffer memory 3215 on respective channels CH1~CHn. The NVM interface 3211 transmits data read from the flash memories 3201~320n to the buffer memory 3215. The NVM interface 3211 can use an interface method of a flash memory. That is, the SSD controller 3210 can perform a program, read or erase operation according to the interface method of the flash memory.

The host interface 3212 provides an interface with the SSD 3200 in response to a protocol of the host 3100. The host interface 3212 can communicate with the host 3100 using a universal serial bus (USB), a small computer system interface (SCSI), a PCI express, an ATA, a parallel ATA (PATA), a serial ATA (SATA), a serial attached SCSI (SAS), etc. The host interface 3212 can perform a disk emulation function of support so that the host 3100 recognizes the SSD 3200 as a hard disk drive (HDD).

The ECC circuit 3213 generates an error correction code ECC using data being transmitted to the flash memories 3201~320n. The generated error correction code ECC is stored in a spare area of the flash memories 3201~320n. The ECC circuit 3213 detects an error of data read from the flash memories 3201~320n. If the detected error is correctable, the ECC circuit 3123 corrects the detected error.

The central processing unit (CPU) 3214 analyzes and processes a signal SGL input from the host 3100. The central processing unit (CPU) 3214 controls the host 3100 or the flash memories 3201~320n through the host interface 3212 or the NVM interface 3211. The central processing unit (CPU) 3214 controls an operation of the flash memories 3201~320n according to firmware for driving the SSD 3200.

The buffer memory 3215 temporarily stores write data being provided from the host 3100 or data read from the flash memory. The buffer memory 3215 can store metadata or cache data to be stored in the flash memories 3201~320n. In a sudden power off operation, metadata or cache data stored in the buffer memory 3215 is stored in the flash memories 3201~320n. The buffer memory 3215 may include a DRAM, an SRAM, etc.

Figure 16:
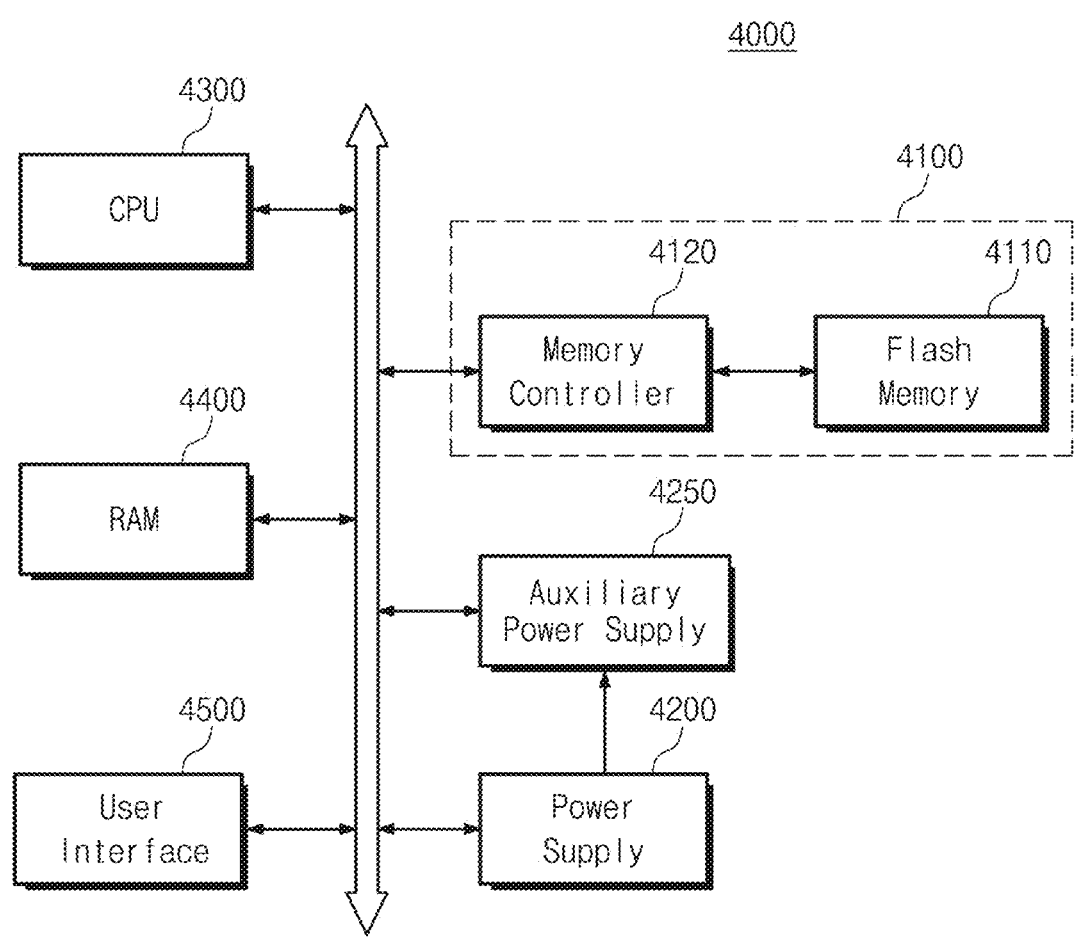
FIG. 16 is a block diagram illustrating an example in which a data storage device in accordance with exemplary embodiments of the disclosure is embodied by an electronic device.

FIG. 16 is a block diagram illustrating an example in which a data storage device in accordance with exemplary embodiments of the disclosure is embodied by an electronic device. The electronic device 4000 can be embodied by a personal computer PC or a portable electronic device such as a notebook computer, a cellular phone, a personal digital assistant (PDA) and a camera.

Referring to FIG. 16, the electronic device 4000 includes a memory system 4100, a power supply 4200, an auxiliary power supply 4250, a central processing unit 4300, a RAM 4400, and a user interface 4500. The memory system 4100 includes a flash memory 4110 and a memory controller 4120.

According to exemplary embodiments of the disclosure, in a program operation of a flash memory device, a level of a voltage being applied to a common source line CSL to increase boosting efficiency can be differently controlled at every program period including at least one program loop. Thus, in a program operation, power consumption can be reduced while boosting efficiency increases.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

The above-disclosed subject matter is to be considered illustrative, and not restrictive, and the appended claims are intended to cover all such modifications, enhancements, and other embodiments, which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A method of programming a three-dimensional memory cell array which includes a plurality of memory cell strings, each of the memory cell strings extending in a direction vertical to a substrate, an upper end of each of the memory cell strings being connected with one of a plurality of bit lines and a lower end of each of the memory cell strings being connected with a common source line, and each of the memory cell strings including a plurality of memory cells, each of the plurality of memory cells being divided into a first memory cell group and a second memory cell group, a first word line being associated with the first memory cell group, and a second word line being associated with the second memory cell group, the method comprising:

executing a first programming loops when a first word line is selected, the first programming loops comprising:

applying a first programming voltage to the first word line;

applying a first common source line voltage to the common source line while applying the first programming voltage;

applying a first verify voltage to the first word line to determine whether memory cells connected to the first word line, among the memory cells, are program-passed or not;

applying a second programming voltage to the first word line;

applying a second common source line voltage to the common source line while applying the second programming voltage; and applying the first verify voltage to the first word line to determine whether memory cells connected to the first word line, among the memory cells, are program-passed or not; and executing a second programming loops when the second word line is selected, the second programming loops comprising:

applying a third programming voltage to the second word line;

applying a third common source line voltage to the common source line while applying the third programming voltage;

applying a second verify voltage to the second word line to determine whether memory cells connected to the second word line, among the memory cells, are program-passed or not;

applying a fourth programming voltage to the second word line;

applying a fourth common source line voltage to the common source line while applying the fourth programming voltage; and applying the second verify voltage to the second word line to determine whether memory cells connected to the second word line, among the memory cells, are program-passed or not.

2. The method of claim 1, wherein the first memory cell group is located closer to the common source line than the second memory cell group.

3. The method of claim 1, wherein a level of the first common source line voltage is larger than a level of the third common source line voltage or the fourth common source line voltage, and wherein a level of the second common source line voltage is larger than the level of the third common source line voltage or the fourth common source line voltage.

4. The method of claim 1, wherein a level of the first common source line voltage and the third common source line voltage is a ground voltage.

5. The method of claim 1, wherein a level of the first common source line voltage and a level of the second common source line voltage is different from each other, and wherein a level of the third common source line voltage and a level of the fourth common source line voltage is identical to each other.

6. The method of claim 1, wherein a level of the first to the fourth common source line voltages are in a range from 1.0 volts to 1.5 volts.

7. The method of claim 1, wherein a difference between the second common source line voltage and the first common source line voltage is larger than a difference between the fourth common source line voltage and the third common source line voltage.

8. The method of claim 1, further comprising:
applying a ground voltage to a bit line, among the bit lines, connected to a selected memory cell string, among the memory cell strings; and
applying a boosting voltage to a bit line, among the bit lines, connected to an unselected memory cell string, among the memory cell strings, while applying programming voltage to the selected word line.

9. The method of claim 2, further comprising:
storing information relating to an inhibit cell ratio and a level of common source line voltage varies in accordance with the inhibit cell ratio during applying the first to the fourth programming voltages.

10. The method of claim 9, wherein the inhibit cell ratio is determined by a memory vendor in a production stage.

11. A method of programming a three-dimensional memory cell array which includes a plurality of memory cell strings, each of the memory cell strings extending in a direction vertical to a substrate, an upper end of each of the memory cell strings being connected with one of a plurality of bit lines and a lower end of each of the memory cell strings being connected with a common source line, and each of the memory cell strings including a plurality of memory cells, each of the plurality of memory cells being divided into a first memory cell group and a second memory cell group, a first word line being associated with the first memory cell group, and a second word line being associated with the second memory cell group, the method comprising:
executing a first programming loops when a first word line is selected, each of the first programming loop comprising:
applying a first programming voltage to the first word line, the first programming voltage being increased according to an execution of each of the first programming loops;
applying a first common source line voltage to the common source line while applying the first programming voltage;
applying a first verify voltage to the first word line to determine whether memory cells connected to the first word line, among the memory cells, are program-passed or not;
executing a second programming loops when the second word line is selected, each of the second programming loop comprising:
applying a second programming voltage to the second word line, the second programming voltage being increased according to an execution of each of the second programming loops;
applying a second common source line voltage to the common source line while applying the third programming voltage;
applying a second verify voltage to the second word line to determine whether memory cells connected to the second word line, among the memory cells, are program-passed or not,
wherein a level of the first common source line voltage is increased according to the execution of each of the first programming loops.

12. The method of claim 11, wherein the first memory cell group is located closer to the common source line than the second memory cell group.

13. The method of claim 11, wherein a level of the first common source line voltage is larger than a level of the second common source line voltage.

14. The method of claim 11, wherein a level of the first common source line voltages are in a range from 1.0 volts to 1.5 volts.

15. The method of claim 11, wherein a level of the second common source line voltage is increased according to the execution of each of the second programming loops.

16. The method of claim 15, wherein a level of the second common source line voltages are in a range from 1.0 volts to 1.5 volts.

17. The method of claim 11, wherein a level of the second common source line voltage is ground voltage.

18. The method of claim 15, wherein an increment of the increased first common source line voltage and is larger than an increment of the increased second common source line voltage.

19. The method of claim 11, further comprising:
applying a ground voltage to a bit line, among the bit lines, connected to a selected memory cell string, among the memory cell strings; and
applying a boosting voltage to a bit line, among the bit lines, connected to an unselected memory cell string, among the memory cell strings, while applying programming voltage to the selected word line.

20. The method of claim 11, further comprising:
storing information relating to inhibit cell ratio and a level of common source line voltage varies in accordance with the inhibit cell ratio during applying the first and the fourth programming voltages.

* * * * *